(12) United States Patent
Takahashi et al.

(10) Patent No.: US 7,141,916 B2
(45) Date of Patent: Nov. 28, 2006

(54) CERAMIC STACK AND A PIEZOELECTRIC/ELECTROSTRICTIVE DEVICE INCLUDING SAME

(75) Inventors: Fumitake Takahashi, Nagoya (JP); Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/376,859

(22) Filed: Mar. 16, 2006

(65) Prior Publication Data

US 2006/0170306 A1    Aug. 3, 2006

Related U.S. Application Data

(62) Division of application No. 10/862,596, filed on Jun. 7, 2004, now Pat. No. 7,062,825, which is a division of application No. 10/236,866, filed on Sep. 6, 2002, now Pat. No. 7,069,630.

(60) Provisional application No. 60/322,185, filed on Sep. 11, 2001.

(30) Foreign Application Priority Data

Jun. 21, 2002    (JP) .............................. 2002-182063

(51) Int. Cl.
 *H01L 41/083* (2006.01)
 *H01L 41/09* (2006.01)
 *H02N 2/00* (2006.01)

(52) U.S. Cl. ........................ 310/328; 310/324; 310/331
(58) Field of Classification Search ................ 310/328, 310/323.01, 323.17, 323.18, 324, 331
See application file for complete search history.

(56) References Cited

U.S. PATENT DOCUMENTS

| | | | |
|---|---|---|---|
| 4,610,741 A | 9/1986 | Mase et al. | |
| 5,237,239 A | 8/1993 | Inoue et al. | |
| 5,288,351 A | 2/1994 | Hoang et al. | |
| 5,407,730 A | 4/1995 | Imanaka | |
| 5,468,290 A | 11/1995 | Kelley | |
| 5,767,612 A * | 6/1998 | Takeuchi et al. | 310/324 |
| 5,809,626 A | 9/1998 | Takeuchi et al. | |
| 5,891,283 A | 4/1999 | Tani et al. | |
| 6,351,056 B1 * | 2/2002 | Takeuchi et al. | 310/328 |
| 6,455,981 B1 | 9/2002 | Takeuchi et al. | |
| 7,015,626 B1 * | 3/2006 | Ikeda et al. | 310/331 |

FOREIGN PATENT DOCUMENTS

| | | |
|---|---|---|
| EP | 1 089 357 A2 | 4/2001 |
| JP | 2-262383 | 10/1990 |
| JP | 5-138620 | 6/1993 |

OTHER PUBLICATIONS

Rhee et al., "Investigation of High Frequency (2.5 GHz, 30 GHz) Processing of Pb-based Piezoelectrics for Ultrasound Transducers", 2000 IEEE Ultrasonics Symposium, Oct. 2000, pp. 981-984, vol. 2.

* cited by examiner

*Primary Examiner*—Darren Schuberg
*Assistant Examiner*—Derek Rosenau
(74) *Attorney, Agent, or Firm*—Burr & Brown

(57) ABSTRACT

A ceramic stack including a plurality of stacked ceramic plates having different lengths, the ceramic stack including an additional member having a curved surface, the additional member being disposed at a border between a first principal surface of the ceramic plate which is long and a side surface of the ceramic plate which is short. The short ceramic plate is stacked on the first principal surface, and the additional member has one or more inflection points on a surface thereof as viewed in a cross-sectional direction.

20 Claims, 18 Drawing Sheets

CERAMIC STACK AND A PIEZOELECTRIC/ELECTROSTRICTIVE DEVICE INCLUDING SAME

CROSS REFERENCE TO RELATED APPLICATION

This application is a division of U.S. application Ser. No. 10/862,596 filed Jun. 7, 2004, now U.S. Pat. No. 7,062,825, which is a division of U.S. application Ser. No. 10/236,866 filed Sep. 6, 2002, now U.S. Pat. No. 7,069,630, which claims the benefit under 35 USC §119(e) of U.S. Provisional Application Ser. No. 60/322,185, filed Sep. 11, 2001, and claims the benefit of Japanese Application 2002-182063, filed Jun. 21, 2002, the entireties of which are incorporated herein by reference.

BACKGROUND OF THE INVENTION

1. Field of the Invention

The present invention relates to a ceramic stack which includes a plurality of ceramic plates having different lengths, a method of producing the ceramic stack, a piezoelectric/electrostrictive device which uses the ceramic stack as a substrate, a method of producing the piezoelectric/electrostrictive device, and a ceramic sintered body.

2. Description of the Related Art

In general, a ceramic stack is manufactured by stacking a plurality of ceramic plates having an identical length, or for example, a ceramic stack 204 is manufactured by stacking a plurality of ceramic plates 200, 202 having different lengths as shown in FIGS. 17 and 18.

The former ceramic stack involves no problem as to strength. However, the latter ceramic stack 204 involves some problem as to strength especially when the long ceramic plate 200 is used as a resonance member, because stress concentration is caused at a border 210 between a first principal surface 206 of the long ceramic plate 200 and a side surface 208 of the short ceramic plate 202 stacked on the first principal surface 206.

Accordingly, for example, a paste 212 is applied to the border 210 so that a bulged reinforcing member 214 having a circular arc-shaped cross section is added to the border 210 as shown in FIG. 17. Alternatively, as shown in FIG. 18, a concaved reinforcing member 216 having a circular arc-shaped cross section is added to the border 210.

However, a conventional example shown in FIG. 17 is equivalent to the case where the length of the short ceramic plate 202 is increased by a length of the reinforcing member 214. That is, when the long ceramic plate 200 is used as a resonance member, the stress is concentrated on a contact portion 218 between the first principal surface 206 of the long ceramic plate 200 and the circular arc-shaped surface of the reinforcing member 214. There is still a problem as to the strength.

Further, when the reinforcing member 214 having a certain thickness is attached to the long ceramic plate 200 to serve as the resonance member, the displacement amount of the long ceramic plate 200 is decreased in an amount corresponding thereto, and the resonance frequency is increased.

On the other hand, in order to add the concave one having the circular arc-shaped cross section to the border 210 as in a conventional example shown in FIG. 18, surface tension of liquid is utilized. In such a case, it is necessary to suppress the viscosity of the paste 212 to be extremely low by increasing the amount of water contained in the paste 212 for the reinforcing member 216. However, when the ceramic stack 204 is manufactured, the sintering step is performed after the application of the paste 212. Therefore, all of water in the paste 212 is evaporated in the sintering step. It is difficult to add the concaved reinforcing member 216 having the circular arc-shaped cross section to the border 210. Further, when the thickness of the short ceramic plate 202 is not more than 50 µm, it is impossible to add any concaved one having a circular arc-shaped cross section to the border 210.

SUMMARY OF THE INVENTION

The present invention has been made taking the foregoing problems into consideration. It is an object of the present invention to provide a ceramic stack and a method of producing the same which make it possible to enhance the strength of the ceramic stack obtained by stacking a plurality of ceramic plates having different lengths and which make it possible to suppress the influence on the resonance frequency and the displacement amount of a resonance member when a long ceramic plate is used as the resonance member.

Another object of the present invention is to provide a piezoelectric/electrostrictive device and a method of producing the same which make it possible to enhance the strength of a resonance portion of the piezoelectric/electrostrictive device and which make it possible to suppress the influence on the resonance frequency and the displacement amount of the resonance portion.

Still another object of the present invention is to provide a ceramic sintered body which makes it possible to enhance the strength of the ceramic sintered body obtained by stacking a plurality of ceramic plates having different lengths and which makes it possible to suppress the influence on the resonance frequency and the displacement amount of a resonance member when a long ceramic plate is used as the resonance member.

According to the present invention, there is provided a ceramic stack comprising a plurality of stacked ceramic plates having different lengths; the ceramic stack including an additional member having a curved surface, the additional member being disposed at a border between a first principal surface of the ceramic plate which is long and a side surface of the ceramic plate which is short, the short ceramic plate being stacked on the first principal surface, wherein the additional member has one or more inflection points on a surface thereof as viewed in a cross-sectional direction.

According to another aspect of the present invention there is provided a method of producing a ceramic stack comprising a plurality of stacked ceramic plates having different lengths, the ceramic stack including an additional member having a curved surface, the additional member being disposed at a border between a first principal surface of the ceramic plate which is long and a side surface of the ceramic plate which is short, the short ceramic plate being stacked on the first principal surface, and the additional member having one or more inflection points on a surface thereof as viewed in a cross-sectional direction; the method comprising the steps of preparing a ceramic green sheet laminate by laminating a first ceramic green sheet to be formed into the long ceramic plate and a second ceramic green sheet to be formed into the short ceramic plate; applying a paste for the additional member to a border between a first principal surface of the first ceramic green sheet and a side surface of the second ceramic green sheet laminated on the first principal surface; and sintering and integrating the ceramic green sheet laminate into one unit to manufacture the ceramic stack.

According to still another aspect of the present invention, there is provided a piezoelectric/electrostrictive device using a ceramic stack as a substrate, said ceramic stack comprising a large number of stacked ceramic plates having different lengths; wherein the ceramic stack includes an additional member having a curved surface, the additional member being disposed at a border between a first principal surface of the ceramic plate which is long and a side surface of the ceramic plate which is short, the short ceramic plate being stacked on the first principal surface; and the additional member has one or more inflection points on a surface thereof as viewed in a cross-sectional direction.

According to still another aspect of the present invention, there is provided a method of producing a piezoelectric/electrostrictive device; the method comprising the steps of laminating a first ceramic green sheet to be formed into the long ceramic plate of the thin plate section thereafter and a second ceramic green sheet to be formed into the short ceramic plate of the fixed section and/or the movable section; applying a paste to a border between a first principal surface of the first ceramic green sheet and a side surface of the second ceramic green sheet laminated on the first principal surface, the paste being used to thereafter form an additional member including a curved surface having one or more inflection points on a cross section; further laminating the plurality of ceramic green sheets to prepare a ceramic green sheet laminate; sintering and integrating the ceramic green sheet laminate into one unit to manufacture the ceramic stack; and forming the piezoelectric/electrostrictive element on the ceramic stack, sintering, and then cutting off unnecessary portions to manufacture the piezoelectric/electrostrictive device.

According to still another aspect of the present invention, there is provided a ceramic sintered body having a ceramic stack comprising a plurality of stacked ceramic plates having different lengths; the ceramic sintered body including an additional member made of ceramics having a curved surface, the additional member being disposed at a border between a first principal surface of the ceramic plate which is long and a side surface of the ceramic plate which is short, the short ceramic plate being stacked on the first principal surface; wherein the additional member has one or more inflection points on a surface thereof as viewed in a cross-sectional direction; and the long ceramic plate, the short ceramic plate, and the additional member are sintered and integrated into one unit.

First of all, the additional member is adhered in a form to cover the border between the long ceramic plate and the short ceramic plate. Therefore, even when any defective portion (any gap or the like) exists at the stacked portion between the long ceramic plate and the short ceramic plate, the defective portion is filled with a part of the additional member. Thus, it is possible to reinforce the ceramic stack.

Further, when the long ceramic plate is resonated in the ceramic stack constructed by stacking the long ceramic plate and the short ceramic plate, some dust is generated at the border in ordinary cases. However, in the present invention, since the additional member is adhered to the border, the generation of the dust from the border is reduced.

Usually, some water may permeate into the boundary surface between the long ceramic plate and the short ceramic plate which are stacked. As a result, some cracks tend to appear. However, the present invention adopts the form in which the additional member is adhered so that the border between the long ceramic plate and the short ceramic plate is covered therewith. Therefore, for example, water does not permeate into the boundary surface between the stacked plates. This results in the improvement in durability at a high temperature and at a high humidity.

The present invention will now be compared with the conventional example described above (an example in which the reinforcing member, which is bulged to have the circular arc-shaped cross section, is added to the border between the long ceramic plate and the short ceramic plate). In the conventional example, the surface of the reinforcing member has a curved portion which is suddenly bulged from the long ceramic plate, and the curved surface is continuously formed up to the side surface of the short ceramic plate. Therefore, this state is equivalent to the fact that the length of the short ceramic plate is increased in the amount corresponding to the length of the reinforcing member. When the long ceramic plate is used as the resonance member, the stress is concentrated on the contact portion between the first principal surface of the long ceramic plate and the circular arc-shaped surface of the reinforcing member. There is still a problem as to the strength.

On the other hand, in the present invention, the surface of the additional member has one or more inflection points as viewed in cross section. Therefore, the additional member is shaped such that curved portions are formed continuously up to the side surface of the short ceramic plate. In fact, the additional member is shaped to have a curved portion which is disposed at the end, a portion which extends along the first principal surface of the long ceramic plate with its surface extending substantially in parallel toward the border, a curved portion which is formed corresponding to the part of the border, and a portion which extends along the side surface of the short ceramic plate with its surface extending substantially in parallel toward the border.

Therefore, in this structure, the thin portion of the additional member (portion which extends along the first principal surface of the long ceramic plate with the surface extending substantially in parallel toward the border) is adhered to the first principal surface of the long ceramic plate. Accordingly, this structure eliminates the concentration of stress on the contact portion between the first principal surface of the long ceramic plate and the end of the additional member. Further, because of the thin portion, the resonance frequency of the long ceramic plate is hardly influenced.

In this structure, the long ceramic plate is supported by the portion of the additional member, the portion being substantially parallel to the first principal surface of the long ceramic plate. Therefore, it is possible to prevent the long ceramic plate from bending, and it is possible to enhance the smoothness. The resonance frequency and the displacement amount of the long ceramic plate can be finely adjusted with ease by adjusting the thickness and/or the length of the portion which is substantially parallel to the first principal surface of the long ceramic plate.

The additional member has the curved surface at the portion corresponding to the border. Therefore, the stress concentration at the border is dispersed, and the strength is scarcely deteriorated, which would be otherwise caused by the resonance of the long ceramic plate. Further, even when the external force is applied by cutting the long ceramic plate when the ceramic stack is cut in the later step, then it is possible to disperse the stress concentration on the border, and any breakage or the like is hardly caused during the cutting process.

As in the conventional example described above, the reinforcing member, which is bulged to have the circular arc-shaped cross section, is added to the border, or the reinforcing member, which has the concaved shape with the circular arc-shaped cross section, is added to the border. Then, the paste which has an extremely high viscosity or an extremely low viscosity is used as the reinforcing member. In such a procedure, usable materials are limited.

In contrast, in the present invention, it is possible to widen the range of selection of materials to be used, because it is unnecessary to use a paste having an extremely high viscosity or an extremely low viscosity.

In the ceramic stack constructed as described above, it is also preferable that three types of the ceramic plates having different lengths are stacked so that the ceramic plate having the shortest length is interposed at a central position; and the additional member is provided at the border between the first principal surface of the ceramic plate having the longest length and the side surface of the ceramic plate having the shortest length stacked on the first principal surface.

In the ceramic stack constructed as described above, it is also preferable that a thickness of the short ceramic plate is larger than a thickness of the long ceramic plate.

In the ceramic stack constructed as described above, a length in a cross section by which the additional member contacts the long ceramic plate may be approximately the same as a length in the cross section by which the additional member contacts the short ceramic plate. Alternatively, the length in the cross section by which the additional member contacts the short ceramic plate may be within 1 to 1/5 (one time through one fifth) as long as a thickness of the short ceramic plate. Further alternatively, the length in the cross section by which the additional member contacts the long ceramic plate may be within 10 to 1/5 (ten times through one fifth) as long as a thickness of the short ceramic plate. Further alternatively, a length in the cross section by which the additional member contacts the short ceramic plate may be shorter than a length in the cross section by which the additional member contacts the long ceramic plate. In the arrangements as described above, the length in the cross section by which the additional member contacts the short ceramic plate may be 1 to 50 μm. Further, a thickness of the long ceramic plate may be 3 to 300 μm.

In the ceramic stack constructed as described above, the additional member may comprise a ceramic material. Alternatively, the additional member may comprise the same material as a material of the long ceramic plate or the short ceramic plate.

Alternatively, the additional member may comprise a metal material or a material containing the metal material. Further alternatively, the additional member may comprise a cermet material.

Especially, in the piezoelectric/electrostrictive device according to the present invention, it is also preferable that a piezoelectric/electrostrictive element is formed on the substrate made of the ceramic stack, and the substrate has a thin plate section formed by the long ceramic plate and a fixed section formed by the short ceramic plate.

In this arrangement, it is preferable that the piezoelectric/electrostrictive element is arranged on a surface portion of a second principal surface of the thin plate section, the second principal surface including the surface portion corresponding to a part of the fixed section. The piezoelectric/electrostrictive element may have a structure including a piezoelectric/electrostrictive layer and an electrode layer which are alternately stacked in a comb-shaped form. Alternatively, the piezoelectric/electrostrictive element may have a structure including not less than four layers of piezoelectric/electrostrictive layers and electrode layers which are alternately stacked in a comb-shaped form.

It is also preferable that the substrate has a pair of thin plate sections formed by the long ceramic plates, a fixed section formed by the short ceramic plate and interposed between the pair of thin plate sections, and movable sections formed by the short ceramic plates and interposed between ends of the pair of thin plate sections.

In this arrangement, owing to the presence of the additional member, it is possible to further enhance the parallel relationship of the pair of thin plate sections. Further, the deviation in length between the left and right sides of the pair of thin plate sections, which may be caused by the stacking deviation between one of the thin plate sections and the fixed section and the stacking deviation between the other of the thin plate sections and the fixed section, can be made approximately identical by adjusting the length of the additional member (length of the portion which extends along the first principal surface of the long ceramic plate with the surface extending substantially in parallel toward the border). It is possible to obtain approximately identical displacement amounts for the left and right sides of the pair of thin plate sections to serve as the vibrating plates.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

With reference to FIGS. 1 to 16, illustrative embodiments are explained in which the ceramic stack, the method of manufacturing the same, and the ceramic sintered body according to the present invention are applied to the piezoelectric/electrostrictive device and the method of manufacturing the same.

The piezoelectric/electrostrictive device according to the embodiment of the present invention includes a device or element for converting between electric energy and mechanical energy by using a piezoelectric/electrostrictive element. Therefore, the piezoelectric/electrostrictive device is most preferably used as an active element such as a variety of actuators and vibrators, especially as a displacement element based on the use of the displacement brought about by the inverse piezoelectric effect and the electrostrictive effect. Furthermore, the piezoelectric/electrostrictive device is also preferably usable as a passive element such as acceleration sensor elements and shock sensor elements.

Figure 1:
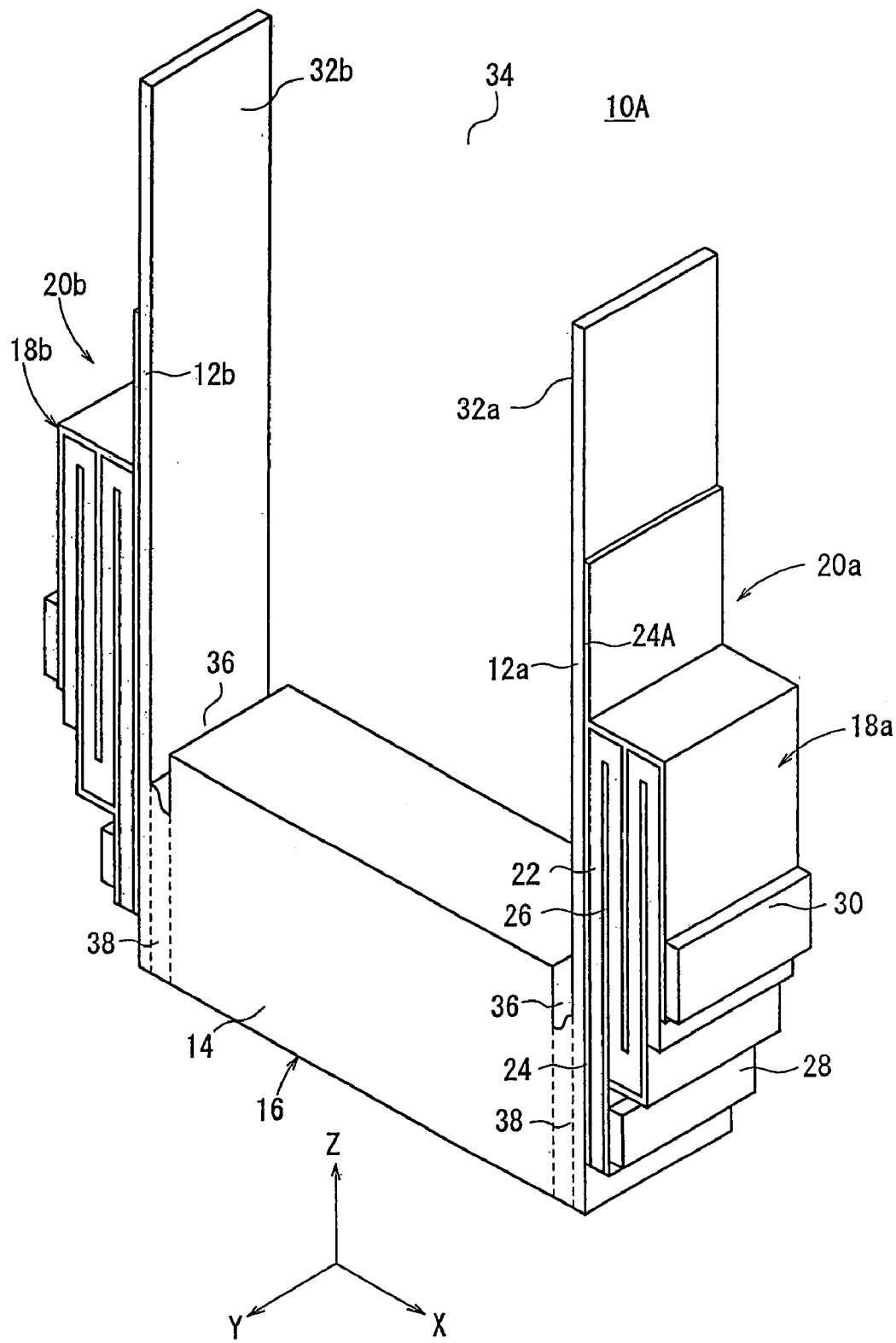
FIG. 1 is a perspective view illustrating a piezoelectric/electrostrictive device according to a first embodiment.
Figure 2:
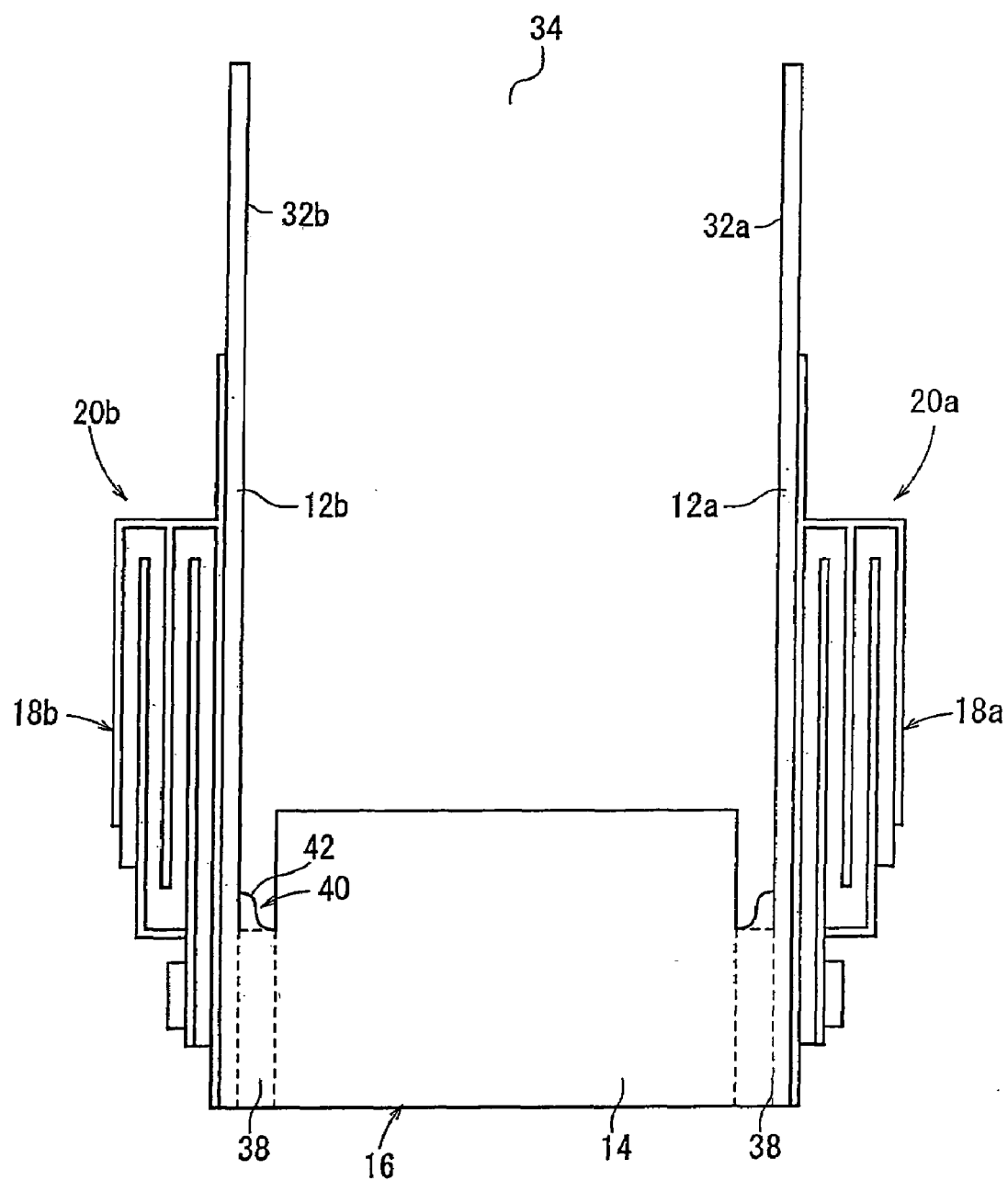
FIG. 2 is a front view illustrating the piezoelectric/electrostrictive device according to the first embodiment.

As shown in FIG. 1, a piezoelectric/electrostrictive device 10A according to a first embodiment has a ceramic substrate 16 integrally comprising a pair of mutually opposing thin plate sections 12a, 12b, and a fixed section 14 for supporting the thin plate sections 12a, 12b. Piezoelectric/electrostrictive elements 18a, 18b are formed on part of the pair of thin plate sections 12a, 12b, respectively.

In the piezoelectric/electrostrictive device 10A, the pair of thin plate sections 12a, 12b are displaced in accordance with the driving of the piezoelectric/electrostrictive elements 18a, 18b, or the displacement of the thin plate sections 12a, 12b is detected by the piezoelectric/electrostrictive elements 18a, 18b. Therefore, in the device shown in FIG. 1, actuator elements 20a, 20b are structured by the thin plate sections 12a, 12b and the piezoelectric/electrostrictive elements 18a, 18b. Accordingly, the pair of thin plate sections 12a, 12b function as vibrating sections which can be vibrated while supported by the fixed section 14.

A gap (air) 34 may be interposed between mutually opposing surfaces 32a, 32b disposed at ends of the pair of thin plate sections 12a, 12b. Alternatively, although not shown, a member made of the same material as or the different material from the material of the thin plate sections 12a, 12b may be interposed between the surfaces 32a, 32b. In this arrangement, the surfaces 32a, 32b also function as attachment surfaces 32a, 32b as well.

The ceramic substrate 16 is composed of a ceramic stack or laminate. For example, several ceramic green sheets are laminated to prepare a ceramic green sheet laminate which is sintered and integrated into the ceramic stack. This feature will be described later on.

Cutouts (cutaways) 36 are provided between the fixed section 14 and the thin plate sections 12a, 12b. The cutout 36 is formed by laminating a plurality of ceramic plates having different lengths (thin plate section 12a, 12b and short ceramic plate 38), or by laminating three types of ceramic plates having different lengths (thin plate section 12a, 12b, short ceramic plate 38, and fixed section 14) with the short ceramic plate 38 being interposed at the center. The thickness of the thin plate section 12a, 12b is approximately the same as the thickness of the short ceramic plate 38.

In the first embodiment, an additional member 42 is provided at a border 40 which is formed by the inner wall surface of the thin plate section 12a, 12b as the long ceramic plate and the side surface (cutout surface) of the short ceramic plate 38.

The integrated ceramics as described above, i.e., the ceramic sintered body scarcely suffers from changes over time, because no adhesive exists on joined portions of the respective parts. Therefore, the joined portions are highly reliable, and the structure is advantageous to ensure rigidity. Further, such an integrated ceramics or the ceramic sintered body can be produced with ease in accordance with a ceramic green sheet-laminating method as described later on.

On the other hand, the piezoelectric/electrostrictive elements 18a, 18b are directly formed on the ceramic substrate 16 by using a film formation method.

Each of the piezoelectric/electrostrictive elements 18a, 18b comprises a piezoelectric/electrostrictive layer 22, and a pair of electrodes 24, 26 formed on both sides of the piezoelectric/electrostrictive layer 22. The first electrode 24 of the pair of electrodes 24, 26 is formed at least on each of the pair of thin plate sections 12a, 12b.

In the first embodiment, each of the piezoelectric/electrostrictive elements 18a, 18b has a multiple stage structure in which the piezoelectric/electrostrictive layer 22 and the electrodes 24, 26 are alternately stacked in a comb-shaped form. In the structure shown in FIGS. 1 and 2, four stages are stacked, provided that one stage is defined by a multi-layered structure in which the piezoelectric/electrostrictive layer 22 is interposed between the electrodes 24, 26. The piezoelectric/electrostrictive element 18a, 18b is not limited to the multiple stage structure as described above, but may have one stage structure.

Figure 3:
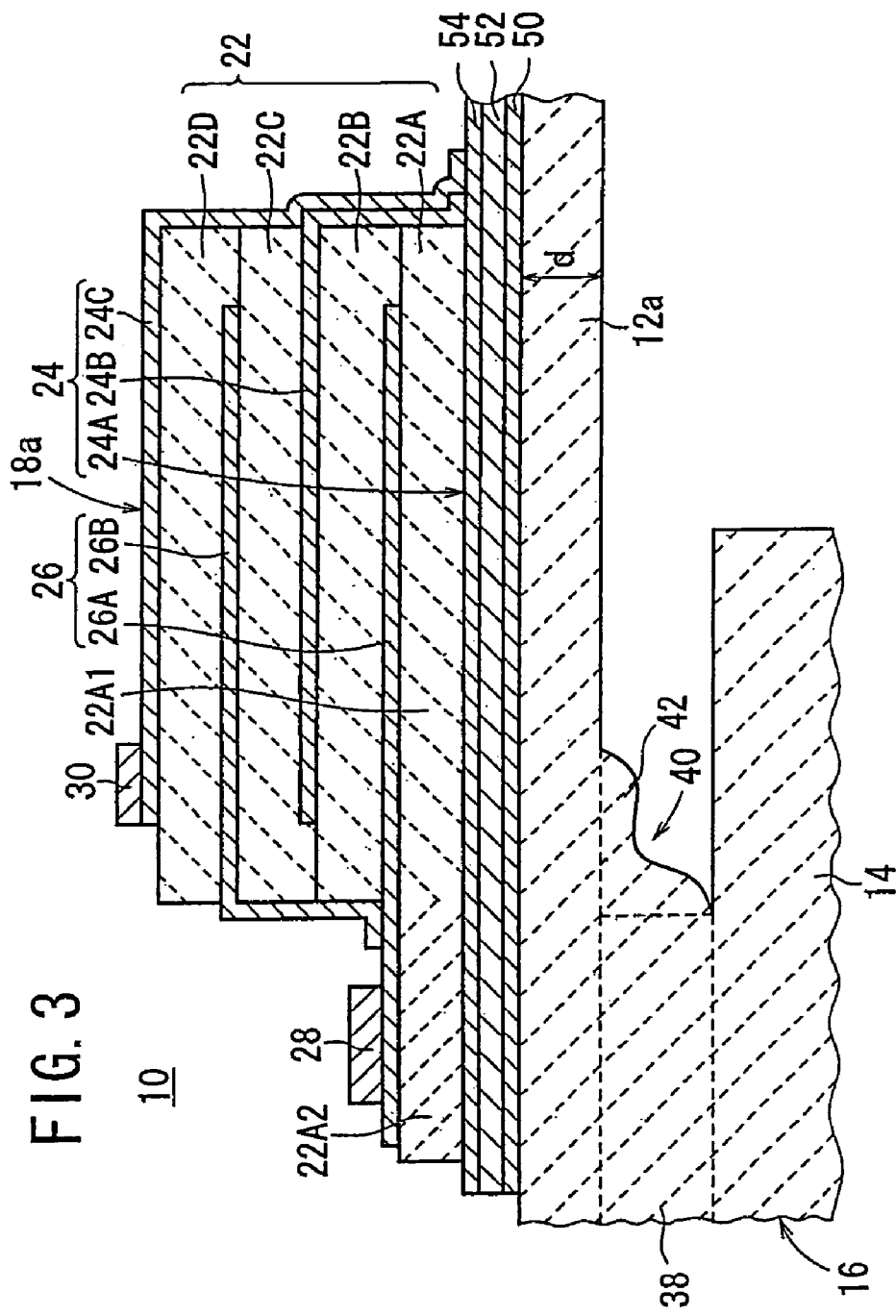
FIG. 3 is a magnified sectional view illustrating a portion of a piezoelectric/electrostrictive element of the piezoelectric/electrostrictive device according to the first embodiment.

As shown in a magnified view of FIG. 3, each of the piezoelectric/electrostrictive elements 18a, 18b includes the piezoelectric/electrostrictive layer 22 having a four-layered structure (first to fourth layers of piezoelectric/electrostrictive layer 22A to 22D). In FIG. 3, the first electrode 24 comprises first, third, and fifth wiring patterns 24A, 24B, 24C, and the second electrode 26 comprises second and fourth wiring patterns 26A, 26B.

The stacked structure of the electrodes 24, 26 and the piezoelectric/electrostrictive layer 22 will be specifically explained principally referring to a structure of the thin plate section 12a. At first, the first wiring pattern 24A is formed substantially continuously over respective side surfaces of the thin plate section 12a, 12b and the fixed section 14 of the ceramic substrate 16. The first layer of piezoelectric/electrostrictive layer 22A is formed at a continuous portion ranging from the fixed section 14 to the thin plate section 12a on the first wiring pattern 24A. The same arrangement is also adopted for the thin plate section 12b.

The first piezoelectric/electrostrictive layer 22A comprises a first section 22A1 made of a first piezoelectric/electrostrictive material which is formed from a part of the thin plate section 12a to a part of the fixed section 14, and a second section 22A2 made of a second piezoelectric/electrostrictive material which is formed on another part of the fixed section 14.

In this embodiment, the first wiring pattern 24A has a three-layered structure. Specifically, the first wiring pattern 24A has a first layer 50 which is directly formed on the thin plate section 12a and which is made of a cermet of a substrate material and an electrode material, a second layer 52 which is formed on the first layer 50 and which is made of an electrode material, and a third layer 54 which is formed on the second layer 52 and which is made of a cermet of a piezoelectric/electrostrictive material and the electrode material.

The stacked structure of the electrodes 24, 26 and the piezoelectric/electrostrictive layer 22 will be further explained. The second wiring pattern 26A is formed on the first layer of piezoelectric/electrostrictive layer 22A. The second layer of piezoelectric/electrostrictive layer 22B is formed over a portion corresponding to the first section 22A1 of the first layer of piezoelectric/electrostrictive layer 22A so that a part (comb tooth portion) of the second wiring pattern 26A is included. The third wiring pattern 24B is formed on the second layer of piezoelectric/electrostrictive layer 22B, and the third wiring pattern 24B is electrically connected to the first wiring pattern 24A. The third layer of piezoelectric/electrostrictive layer 22C is formed over a portion corresponding to the first section 22A1 of the first layer of piezoelectric/electrostrictive layer 22A so that a part (comb tooth portion) of the third wiring pattern 24B is included.

Further, the fourth wiring pattern 26B is formed on the third layer of piezoelectric/electrostrictive layer 22C, and the fourth wiring pattern 26B is electrically connected to the second wiring pattern 26A. The fourth layer of piezoelectric/electrostrictive layer 22D is formed over a portion corresponding to the first section 22A1 of the first layer of piezoelectric/electrostrictive layer 22A so that a part (comb tooth portion) of the fourth wiring pattern 26B is included. The fifth wiring pattern 24C is formed on the fourth layer of piezoelectric/electrostrictive layer 22D, and the fifth wiring pattern 24C is electrically connected to the first wiring pattern 24A.

A first connecting terminal 28 is formed on a portion of the second wiring pattern 26A which is not the comb tooth portion, i.e., on a portion corresponding to the second section 22A2 of the first layer of piezoelectric/electrostrictive layer 22A. A second connecting terminal 30 is formed at an end of the fifth wiring pattern 24C.

Therefore, the portion of the stacked structure of the piezoelectric/electrostrictive element 18a (18b as well), which corresponds to the first section 22A1 of the first layer of piezoelectric/electrostrictive layer 22A, can be defined as a substantial operating section which functions as an actual driving section (or a sensing section).

In this embodiment, the fifth wiring pattern 24C of the uppermost layer of the first electrode 24 is made of a resinate which is an electrode material. Each of the wiring patterns (second to fourth wiring patterns 26A, 24B, 26B) of the respective electrodes 24, 26, which is formed inside of the piezoelectric/electrostrictive element 18a (18b as well), is obtained by sintering a cermet film containing an electrode material and a piezoelectric/electrostrictive material.

In this arrangement, the volume ratio between the electrode material and the piezoelectric/electrostrictive material is preferably 4:6 through 9:1, because it is necessary that the second to fourth wiring patterns 26A, 24B, 26B function as conductor layers. If the volume ratio of the electrode material is smaller than 4, it is difficult to function as a conductor. If the volume ratio of the electrode material is larger than 9, both of the effect to thin the electrode and the adhesion force to be exerted on the piezoelectric/electrostrictive layer may be reduced. When the blending condition is satisfied as described above, respective intermediate patterns can be formed as conductor layers each of which is not more than 2 μm. Further, the conductor layers are prevented from partly lacking, and defects are avoided. It is possible to obtain a pattern as designed substantially exactly.

Figure 4:
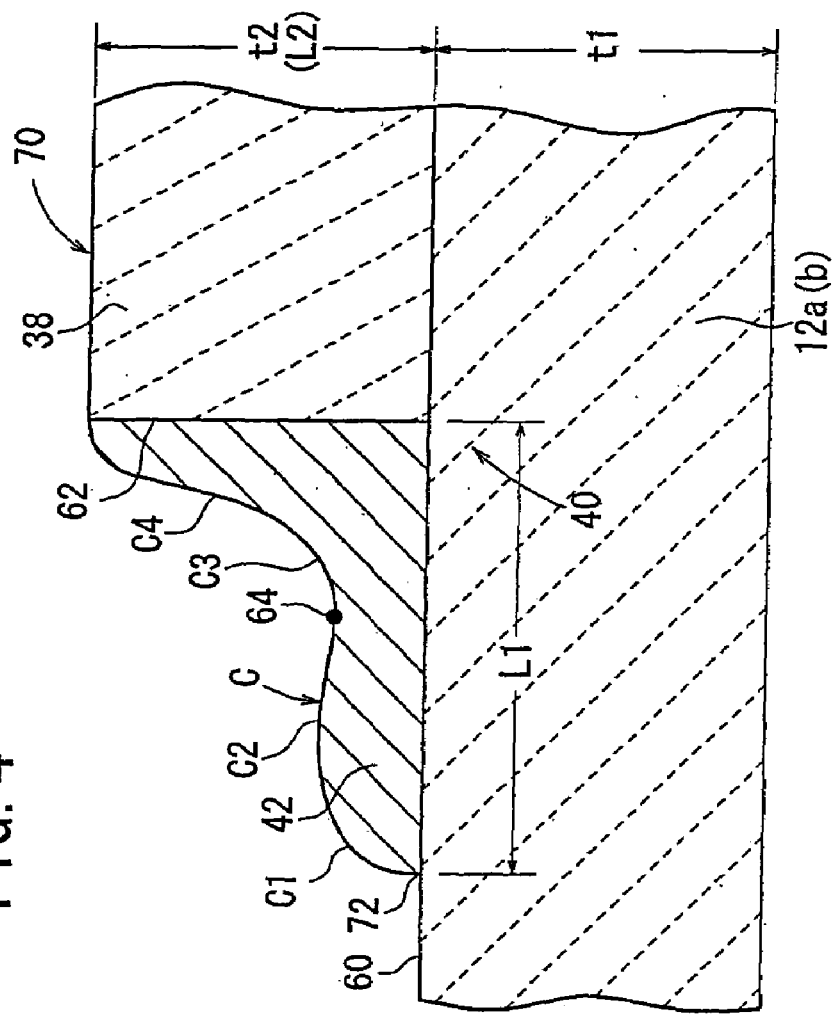
FIG. 4 is a magnified perspective view illustrating a border between a thin plate section and a short ceramic plate.

In the piezoelectric/electrostrictive device 10A according to the first embodiment, as shown in a magnified view of FIG. 4, the additional member 42 is provided at the border 40 between the inner wall surface 60 of each of the thin plate section 12a, 12b and the side surface (cutout surface) 62 of the short ceramic plate 38.

That is, as shown in FIG. 4, assuming that the surface of the additional member 42 is represented by a curve C as viewed in a vertical cross section, the curve C is a free curve having one inflection point 64. In this connection, a quadratic curve (parabola) has no inflection point, and the curve cannot express the change of the direction of the curve. On the other hand, the cubic curve can express only one inflection point. Therefore, the cubic expression has the lowest order to depict the free curve.

The free curve in the embodiment of the present invention includes parametric cubic curves such as Hermite curve, Bezier curve, B-spline curve, and Catmul-Rom curve.

As described above, in the piezoelectric/electrostrictive device 10A according to the first embodiment, the additional member 42 is adhered to cover the border 40 which is formed by the thin plate section 12a (12b) and the short ceramic plate 38. Therefore, even when any defective portion (gap or the like) is present at the stacked portion between the thin plate section 12a (12b) and the short ceramic plate 38 and the stacked portion between the short ceramic plate 38 and the fixed section 14, the defective portion is filled with a part of the additional member 42. Thus, it is possible to reinforce the ceramic substrate 16.

Further, when the thin plate sections 12a, 12b are resonated, some dust is generated at the border 40 in ordinary cases. However, in the first embodiment, the additional member 42 is adhered to the border 40. Therefore, the generation of dust from the border 40 is reduced.

Usually, some water may permeate into the boundary surface between the thin plate section 12a (12b) and the short ceramic plate 38 which are stacked, resulting in some cracks. However, in the embodiment of the present invention, the additional member 42 is adhered so that the border 40 between the thin plate section 12a (12b) and the short ceramic plate 38 is covered therewith. Therefore, water does not permeate into the boundary surface between the stacked plates. This results in the improvement in durability under high temperature and high humidity.

The ceramic stack (hereinafter referred to as "ceramic stack 70 according to the first embodiment") of the piezoelectric/electrostrictive device 10A according to the first embodiment constructed by the thin plate section 12a (12b) and the short ceramic plate 38 as shown in FIG. 4 will now be compared with the conventional example shown in FIG. 17 (an example in which the reinforcing member 214, which is bulged to have the circular arc-shaped cross section, is added to the border 210 formed by the long ceramic plate 200 and the short ceramic plate 202).

Figure 17:
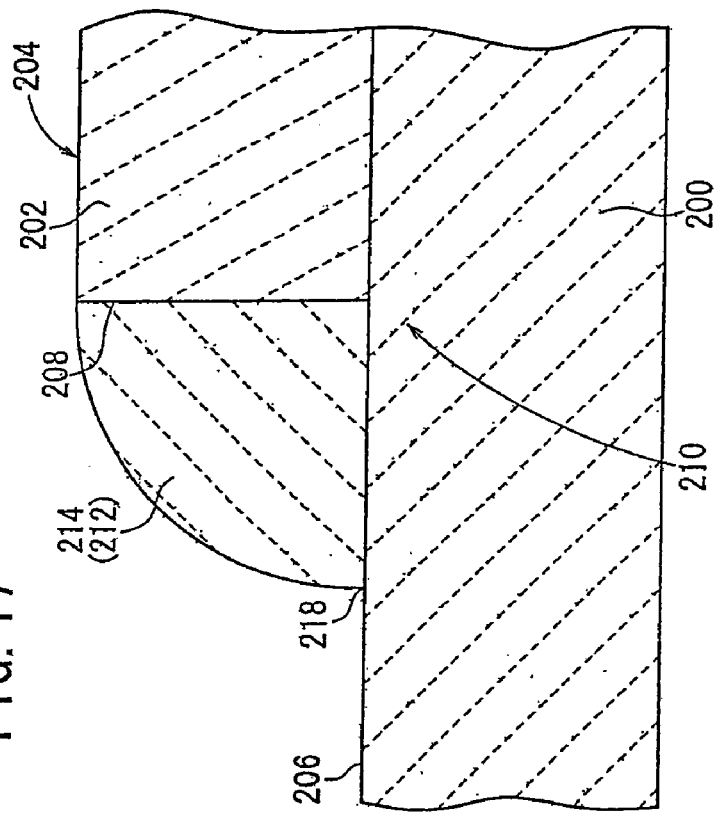
FIG. 17 is a sectional view illustrating the first conventional example in which a reinforcing member is formed at a border of a ceramic stack.

In the conventional example shown in FIG. 17, the surface of the reinforcing member 214 has a curved portion which is suddenly bulged from the long ceramic plate 200, and is continuously formed up to the side surface 208 of the short ceramic plate 202. Therefore, this is equivalent to the case where the length of the short ceramic plate 202 is increased in the amount corresponding to the length of the reinforcing member 214. When the long ceramic plate 200 is used as the resonance member, the stress is concentrated on the contact portion 218 between the first principal surface 206 of the long ceramic plate 200 and the circular arc-shaped surface of the reinforcing member 214. There is still a problem as to the strength.

On the other hand, in the ceramic stack 70 according to the first embodiment, as shown in FIG. 4, the surface of the additional member 42 has one inflection point 64 as viewed in cross section. Therefore, curved portions of the additional member 42 are formed up to the side surface 62 of the short ceramic plate 38. In fact, the additional member 42 has a curved portion C1 which is disposed at the end, a portion C2 which extends along the inner wall surface 60 of the thin plate section 12$a$ (12$b$) with its surface extending substantially in parallel toward the border 40, a curved portion C3 which is formed corresponding to the part of the border 40, and a portion C4 which extends along the side surface 62 of the short ceramic plate 38 with its surface extending substantially in parallel toward the border 40.

Therefore, in this structure, the thin portion of the additional member 42 (portion C2 which extends along the inner wall surface 60 of the thin plate section 12$a$ (12$b$) with the surface extending substantially in parallel toward the border 40) is adhered to the inner wall surface 60 of the thin plate section 12$a$ (12$b$). Accordingly, this structure eliminates the concentration of stress on the contact portion 72 between the inner wall surface 60 of the thin plate section 12$a$ (12$b$) and the end of the additional member 42. Further, because the portion C2 is thin, the resonance frequency of the thin plate section 12$a$ (12$b$) is hardly influenced.

In this structure, the thin plate section 12$a$ (12$b$) is supported by the portion C2 of the additional member 42 while the portion C2 is substantially parallel to the inner wall surface 60 of the thin plate section 12$a$ (12$b$). Therefore, it is possible to enhance the smoothness of the thin plate section 12$a$ (12$b$). The resonance frequency and the displacement amount of the thin plate section 12$a$ (12$b$) can be finely adjusted with ease by adjusting the thickness and/or the length of the portion C2 which is substantially parallel to the inner wall surface 60 of the thin plate section 12$a$ (12$b$).

The additional member 42 has the curved surface C3 at the portion corresponding to the border 40. Therefore, the stress concentration at the border 40 is dispersed, and the strength is scarcely deteriorated, which would be otherwise caused by the resonance of the thin plate section 12$a$ (12$b$). Further, even if the external force is applied to the thin plate section 12$a$ (12$b$) when the ceramic stack 70 according to the first embodiment is cut in the following step, it is possible to disperse the stress concentration on the border 40, and any breakage or the like is hardly caused in cutting.

Figure 18:
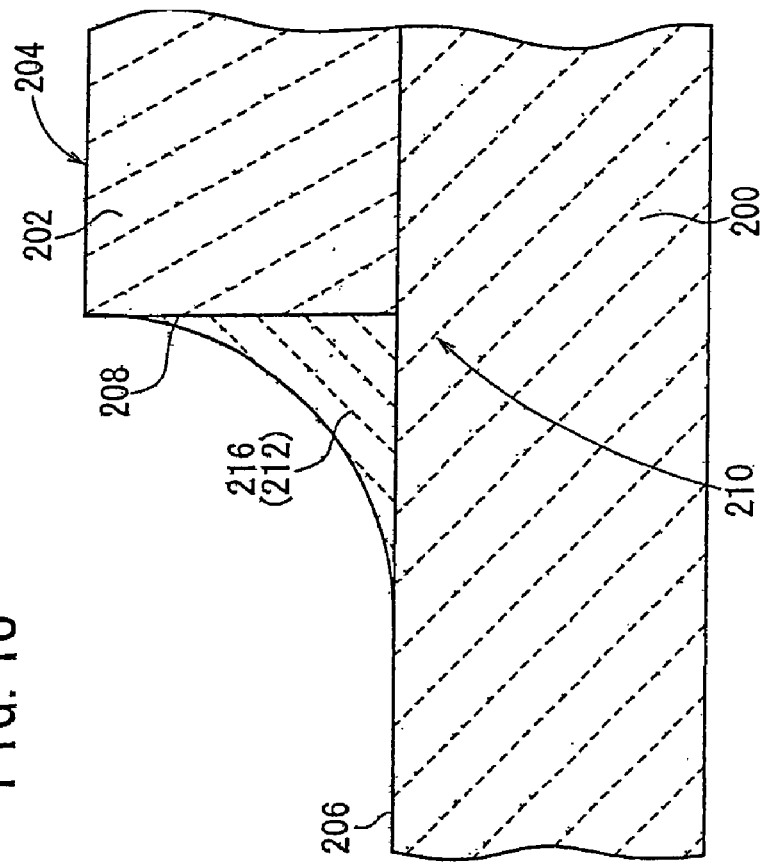
FIG. 18 is a sectional view illustrating the second conventional example in which a reinforcing member is formed at a border of a ceramic stack.

When the reinforcing member 214, which is bulged to have the circular arc-shaped cross section, is added to the border 210 as in the conventional example shown in FIG. 17, or when the reinforcing member 216, which has the concaved shape with the circular arc-shaped cross section, is added to the border 210 as in the conventional example shown in FIG. 18, the paste having an extremely high viscosity or an extremely low viscosity is used for the reinforcing member 214, 216. In this case, usable materials are limited.

In contrast, in the ceramic stack 70 according to the first embodiment, it is possible to use various materials, because it is unnecessary to use any paste having an extremely high viscosity or any paste having an extremely low viscosity.

In the embodiment described above, as shown in FIG. 4, the thickness t1 of the thin plate section 12$a$ (12$b$) is approximately the same as the thickness t2 of the short ceramic plate 38. However, the thickness t2 of the short ceramic plate 38 may be different from the thickness t1 of the thin plate section 12$a$ (12$b$). The length of contact L1 where the additional member 42 contacts the thin plate section 12$a$ (12$b$) in the cross section may be approximately the same as the length of contact L2 where the additional member 42 contacts the short ceramic plate 38. Alternatively, the length of contact L2 may be within 1 to ⅕ as long as the thickness t2 of the short ceramic plate 38. Alternatively, the length of the contact L2 may be shorter than the length of the contact L1. In the arrangements as described above, the length of contact L2 may be 1 to 50 μm. Further, the length of contact L1 may be within 10 to ⅕ as long as the thickness t2 of the short ceramic plate 38.

The additional member 42 may be composed of a ceramic material. Alternatively, the additional member 42 may be composed of the same material as that for the thin plate section 12$a$ (12$b$) or the short ceramic plate 38. Further alternatively, the additional member 42 may be composed of a metal material or a material containing the metal material. Further alternatively, the additional member 42 may be composed of a cermet material.

Next, an explanation will be made with reference to FIGS. 5 to 14 about a method of producing the piezoelectric/electrostrictive device 10A according to the first embodiment. At first, the following definitions are made. A ceramic green sheet laminate 80 is defined as a laminate which is obtained by laminating ceramic green sheets (see, for example, FIG. 13). A ceramic stack 82 is defined as a product which is obtained by sintering the ceramic green sheet laminate 80 into one unit (see, for example, FIG. 14). A ceramic substrate 16 is defined as a product which is obtained by cutting off unnecessary portions from the ceramic stack 82 to integrally have the thin plate sections 12$a$, 12$b$ and the fixed section 14 (see FIG. 1).

In this production method, the ceramic stack 82 is finally cut into chip units so that a large number of piezoelectric/electrostrictive devices 10A are produced in identical steps. In this method, it is supposed that a plurality of piezoelectric/electrostrictive devices 10A are arranged in a vertical direction and in a lateral direction respectively in one substrate. However, in order to simplify the explanation, the following description will be made assuming that one piezoelectric/electrostrictive device 10A is produced.

Figure 5:
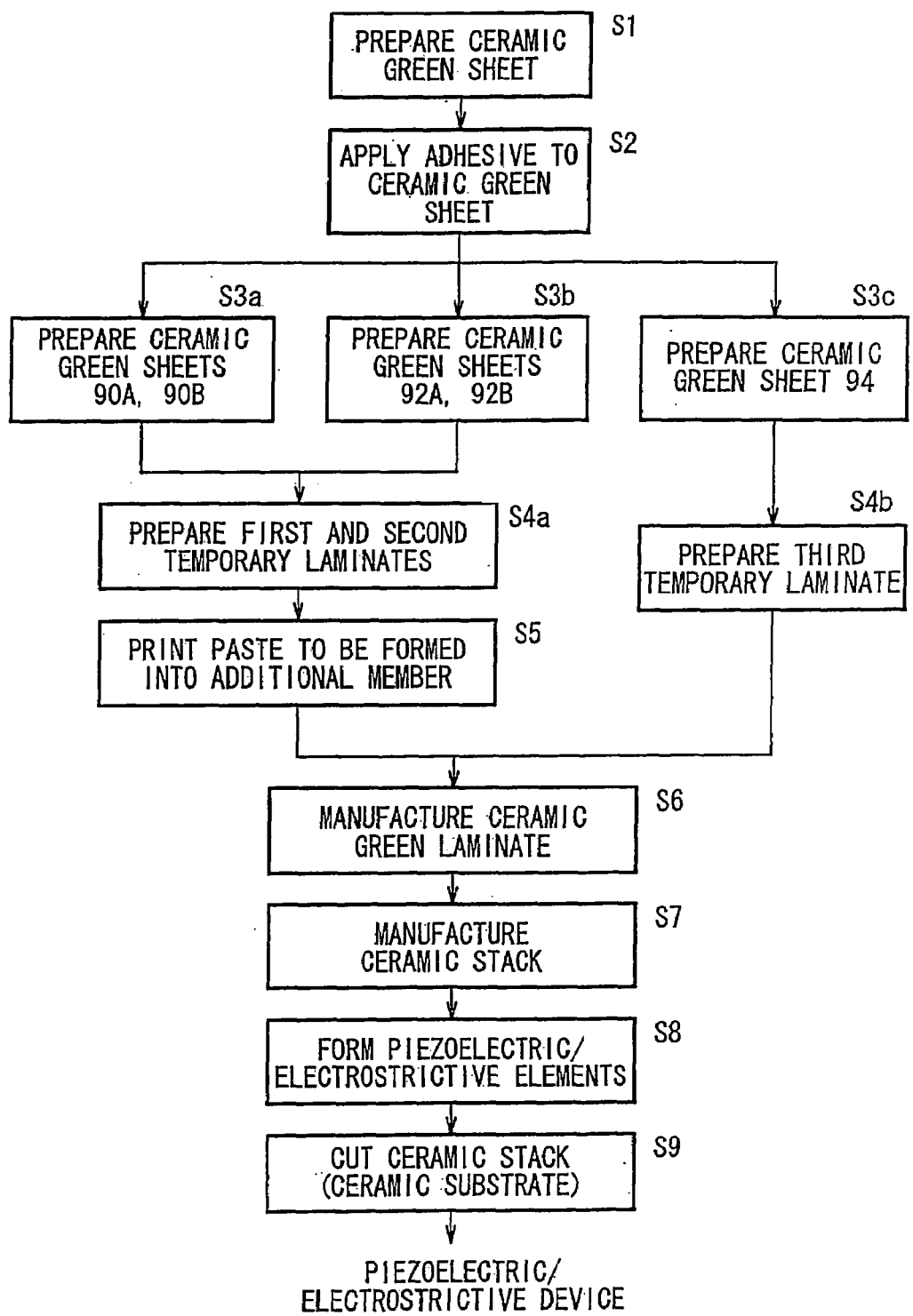
FIG. 5 shows a block diagram illustrating steps of a method of producing the piezoelectric/electrostrictive device according to the first embodiment.

At first, a binder, a solvent, a dispersing agent, a plasticizer, and other components are added and mixed with a ceramic powder such as zirconia to prepare a slurry in Step S1 shown in FIG. 5. The slurry is subjected to a defoaming treatment to thereafter prepare a ceramic green sheet having a predetermined thickness by means of a method such as the reverse roll coater method or the doctor blade method.

After that, in Step S2 shown in FIG. 5, an adhesive (for example, a ceramic paste) is applied to required portions on the respective ceramic green sheets, for example, by means of screen printing.

Figure 6:
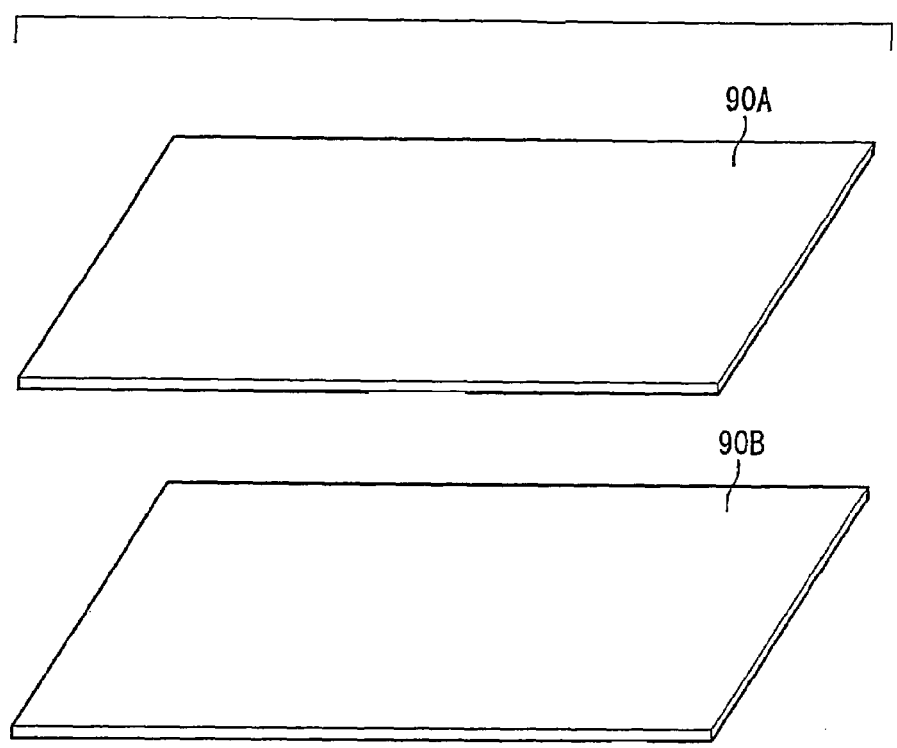
FIG. 6 is a perspective view illustrating ceramic green sheets to be formed into a thin plate section thereafter.
Figure 7:
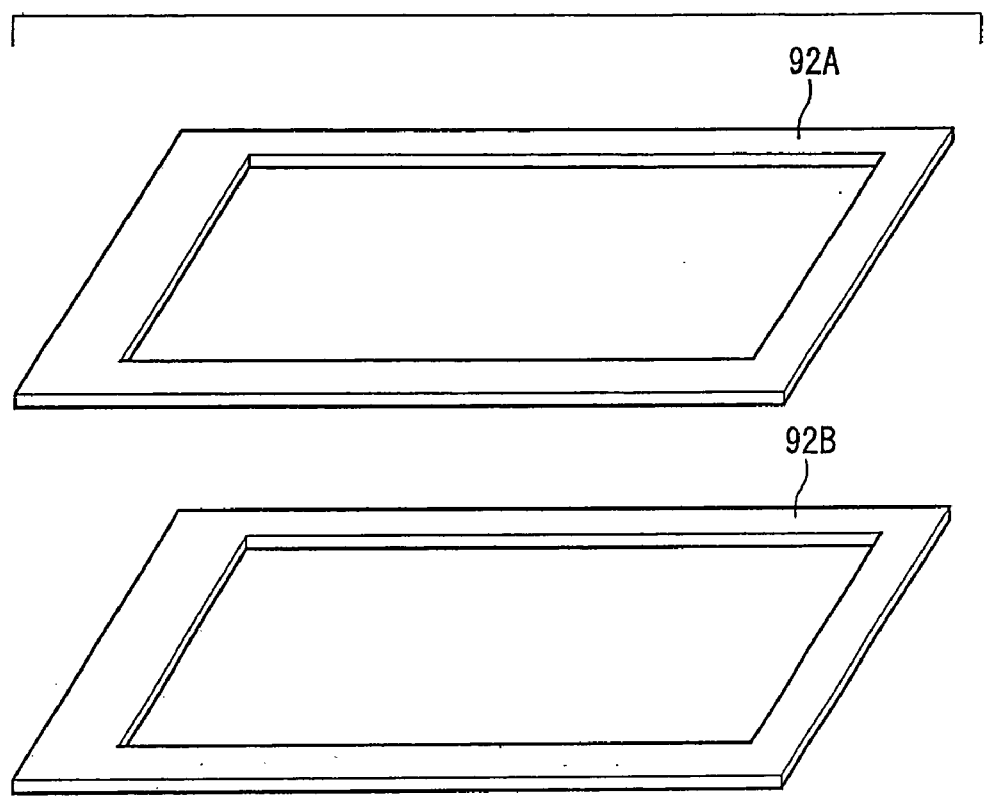
FIG. 7 is a perspective view illustrating ceramic green sheets to be formed into a short ceramic plate thereafter.

After that, in Step S3$a$, Step S3$b$, and Step S3$c$ shown in FIG. 5, the respective ceramic green sheets are subjected, for example, to laser machining or punching out by using a mold. Especially, in Step S3$a$, the ceramic green sheets 90A, 90B, which are formed into the thin plate sections 12$a$, 12$b$ thereafter, are prepared by the machining as shown in FIG. 6. In Step S3$b$ shown in FIG. 5, the ceramic green sheets 92A, 92B, which are formed into the short ceramic plates 38 thereafter, are prepared by the machining as shown in FIG.

Figure 8:
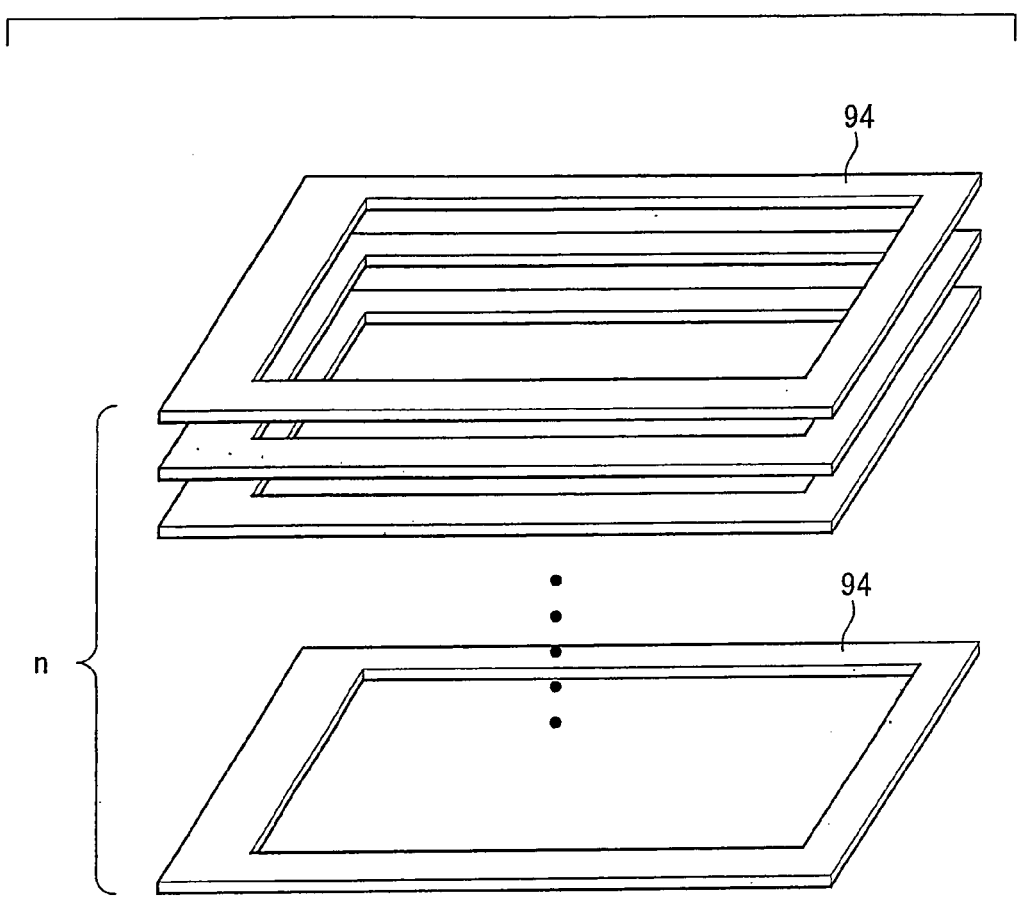
FIG. 8 is a perspective view illustrating ceramic green sheets to be formed into a fixed section thereafter.

7. In Step S3c shown in FIG. 5, "n" sheets of the ceramic green sheets 94, which are formed into the fixed section 14 thereafter, are prepared by the machining as shown in FIG. 8.

Figure 9:
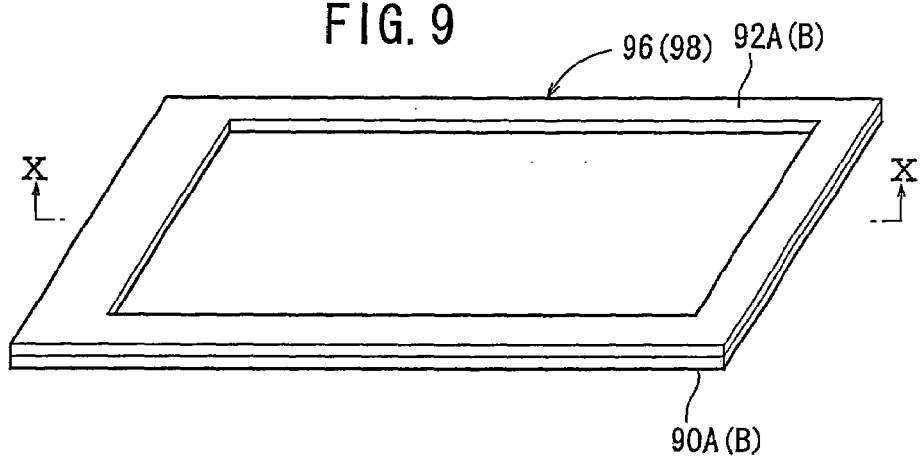
FIG. 9 is a perspective view illustrating first and second temporary laminates.
Figure 10:
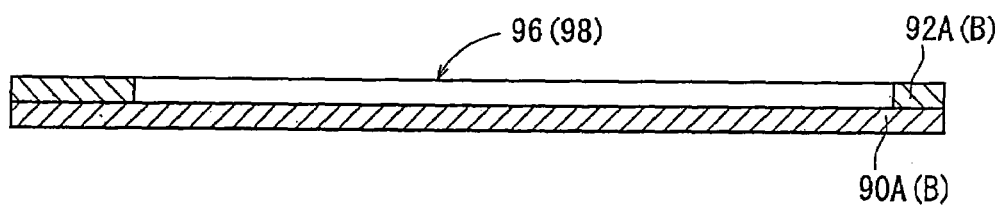
FIG. 10 is a sectional view taken along a line X—X shown in FIG. 9.
Figure 11:
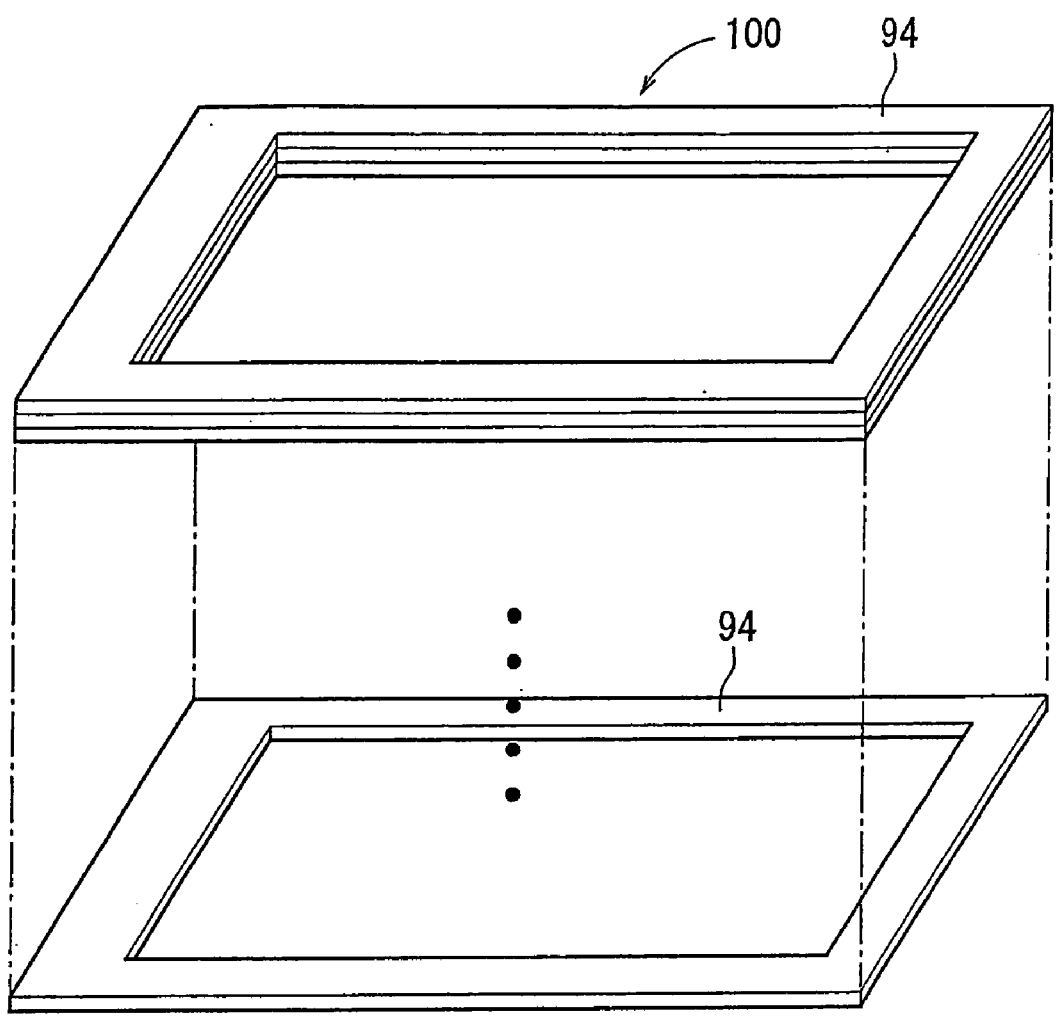
FIG. 11 is a perspective view illustrating a third temporary laminate.

After that, in Step S4a shown in FIG. 5, the ceramic green sheet 90A and the ceramic green sheet 92A are temporarily laminated to prepare a first temporary laminate 96 (see FIGS. 9 and 10), and the ceramic green sheet 90B and the ceramic green sheet 92B are temporarily laminated to prepare a second temporary laminate 98 (see FIGS. 9 and 10). In Step S4b, the "n" ceramic green sheets 94 are temporarily laminated to prepare a third temporary laminate (see FIG. 11). In the temporary lamination as described above, the adhesive is applied, for example, by means of the screen printing to the required portions of the ceramic green sheets 90A, 90B, 92A, 92B and the "n" ceramic green sheets 94 respectively. Therefore, these laminated sheets are prevented from easily collapsing.

After that, in Step S5 shown in FIG. 5, a paste 102, which is formed into the additional member 42 thereafter, is applied, for example, by means of the screen printing to the border 40 formed by the first principal surface 60 of the ceramic green sheet 90A and the side surface 62 of the ceramic green sheet 92A of the first temporary laminate 96.

Figure 12:
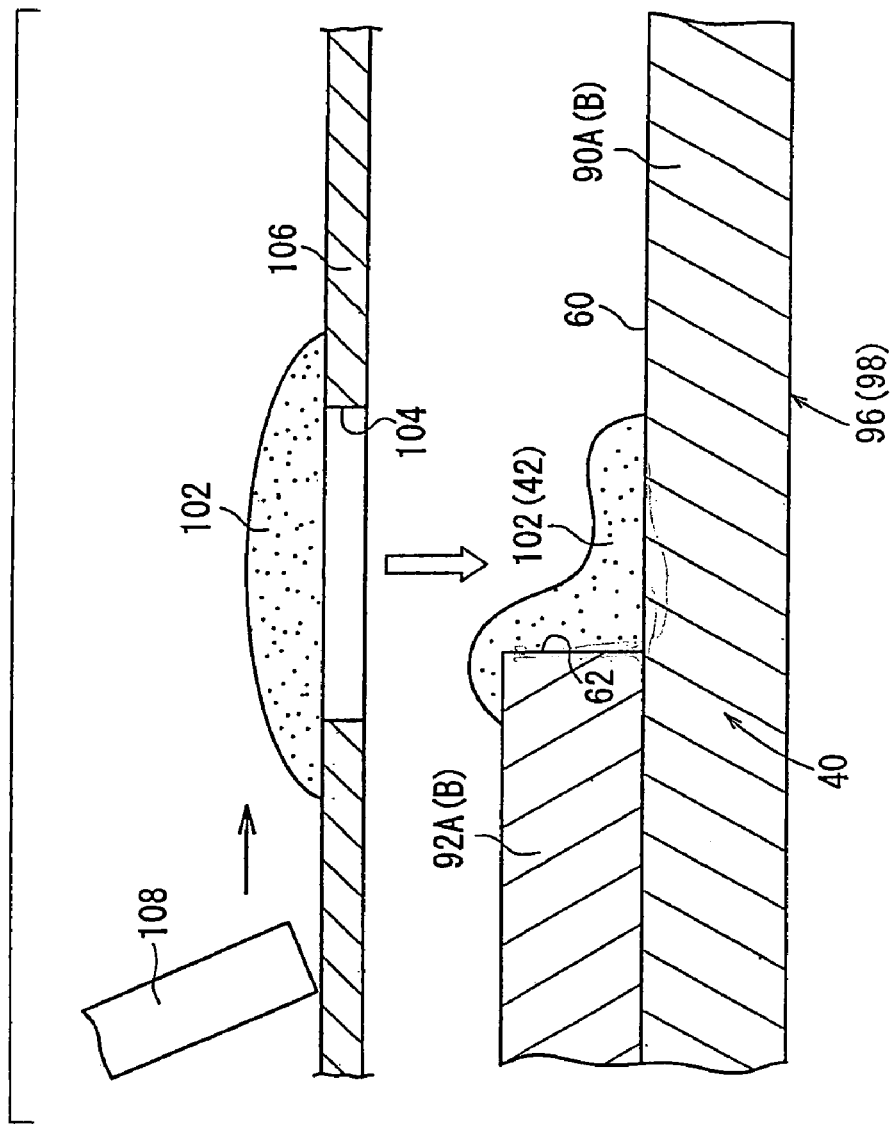
FIG. 12 illustrates a step for printing a paste onto a border of the first or second temporary laminate, the paste being formed into an additional member thereafter.

In this procedure, a printing plate 106 having a window 104 at a portion corresponding to the border 40 is used as shown in FIG. 12. The paste 102 is applied to the border 40 through the window 104 by sliding a squeegee 108 over the paste 102 supplied onto the printing plate 106. When applied, the paste 102 is adhered continuously at least over a range from the first principal surface 60 of the ceramic green sheet 90A to the side surface 62 of the ceramic green sheet 92A. Accordingly, after sintering which is performed later, the surface of the additional member 42 of the paste 102 has one inflection point 64 on the cross section as shown in FIG. 4.

It is preferable that the composition of the paste 102 is basically equivalent to the composition or the material of the thin plate section 12a, 12b. For example, the paste 102 obtained by mixing a ceramic powder, a binder, an additive, and a solvent, is used. For example, the ceramic powder to be used is obtained by adding a minute amount of $Y_2O_3$ to $ZrO_2$. PVB, ethyl cellulose, or a mixture of them is added as the binder to the ceramic powder by 10 to 20% by weight of the ceramic powder. A plasticizer and a dispersing agent are added as the additive to the ceramic powder by several percents by weight of the ceramic powder. As for the solvent, an appropriate amount of 2-ethylhexanol as a second solvent is added to acetone as a first solvent.

It is desirable that a viscosity of the paste 102 allows the paste 102 to be smoothly applied to the border 40 through the window 104 of the printing plate 106 and allows the paste 102 after printing to flow and shape on the border 40 appropriately before drying. If the viscosity is too high, then the paste 102 does not have a desired shape after the application, and it may be agglomerated. On the other hand, if the viscosity is too low, then no sufficient thickness is obtained after drying, and the desired shape may not be formed. In order to determine the condition, it is necessary to consider the thickness of the short ceramic plate 38, the thickness of the printing plate 106, and the viscosity. In this embodiment, the viscosity of the paste 102 is 1 to 100,000 cps.

Similarly, the paste 102, which is formed into the additional member 42 thereafter, is applied by the screen printing to the border 40 formed by the first principal surface 60 of the ceramic green sheet 90B and the side surface 62 of the ceramic green sheet 92B of the second temporary laminate 98.

Figure 13:
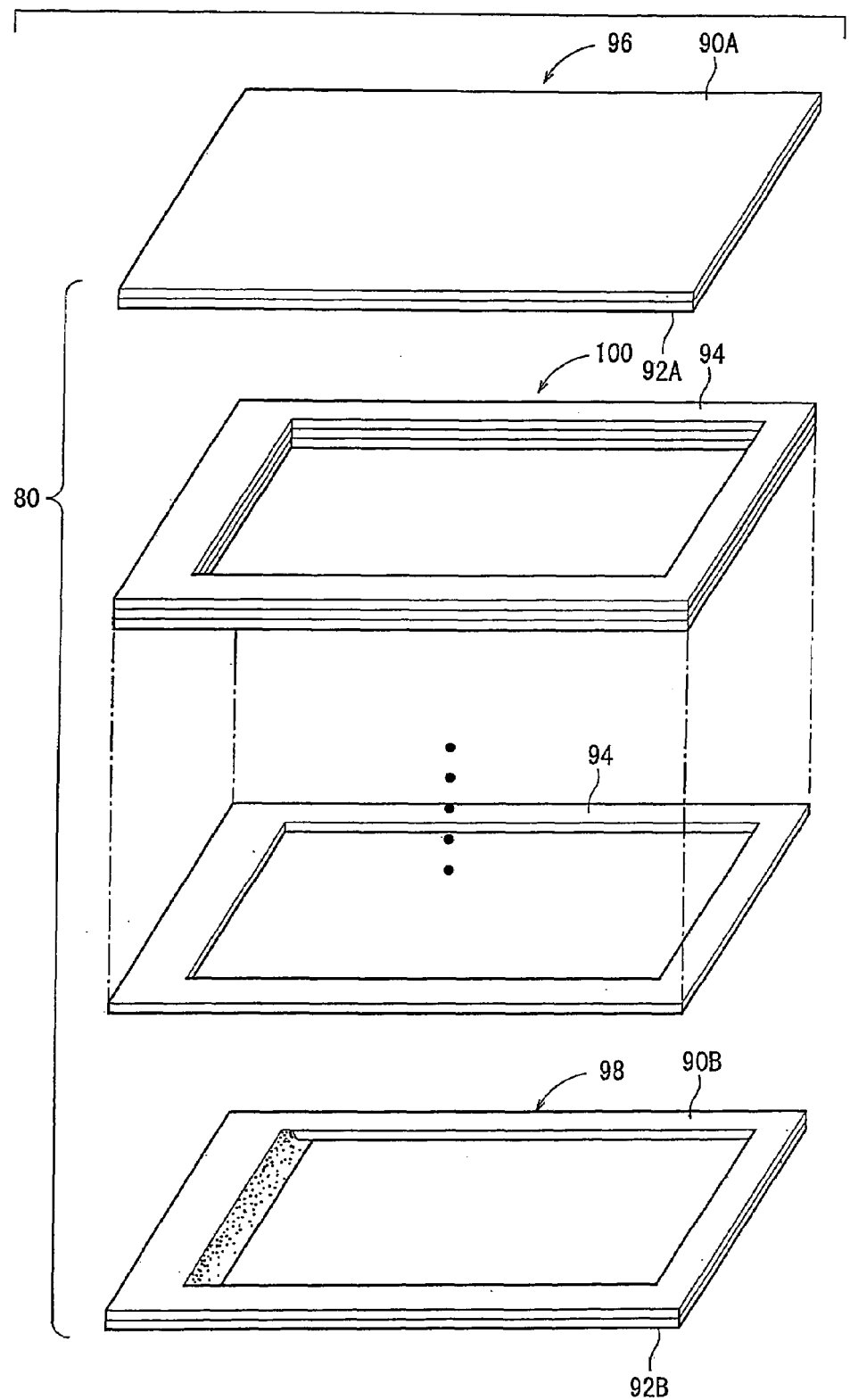
FIG. 13 illustrates a process of manufacturing a ceramic green sheet laminate by laminating the first to third temporary laminates.

After that, in Step S6 shown in FIG. 5, the first to third temporary laminates 96, 98, 100 are laminated so that the third temporary laminate 100 is interposed between the first and second temporary laminates 96, 98 as shown in FIG. 13, followed by securing under a pressure to prepare the ceramic green sheet laminate 80. During this process, the paste 102 may protrude over the ceramic green sheet 92A, 92B. However, the protruding portion is buried when the third temporary laminate 100 is laminated. Therefore, it is unnecessary to consider the protruding portion.

Figure 14:
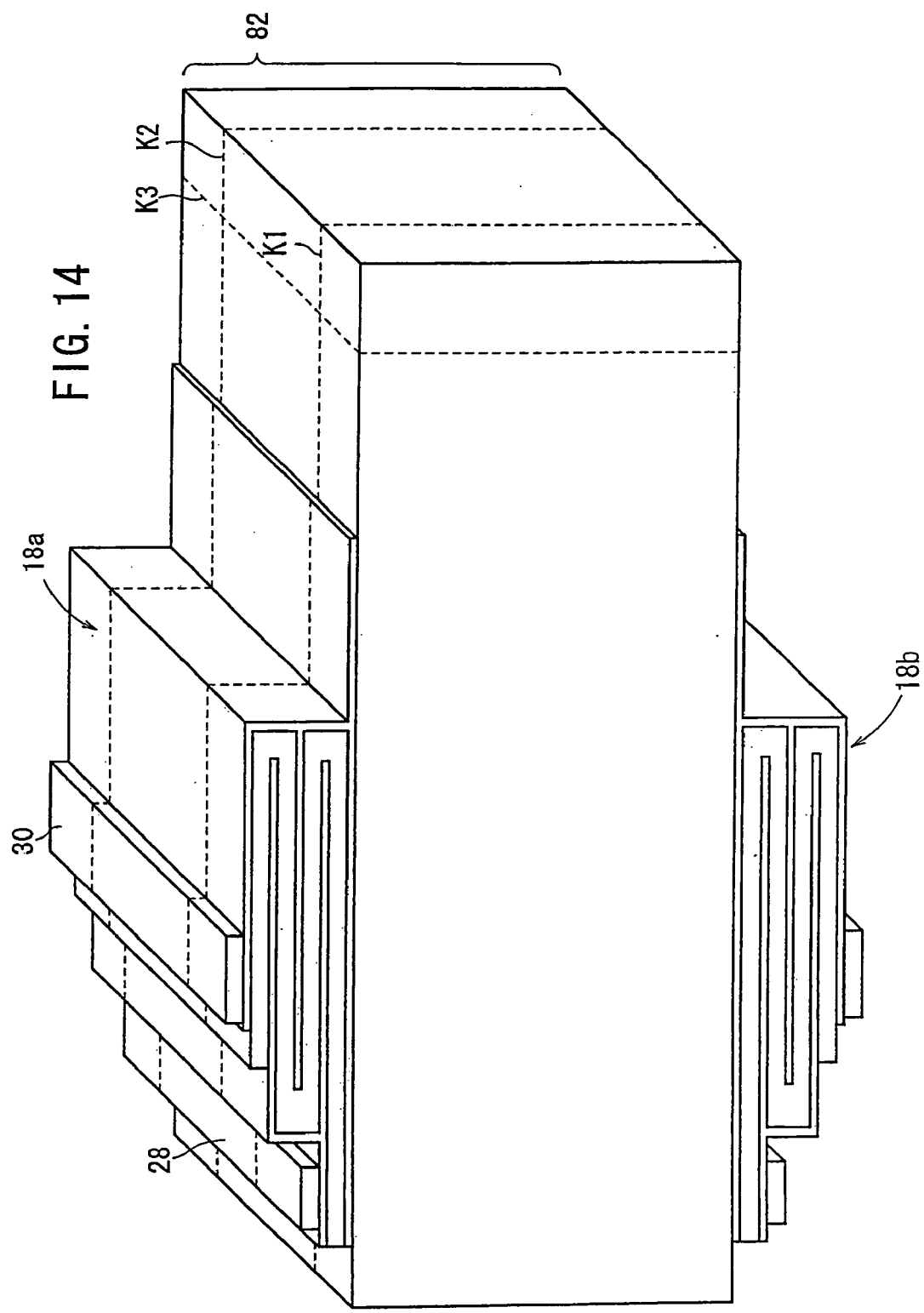
FIG. 14 illustrates piezoelectric/electrostrictive elements formed after forming a ceramic stack by sintering the ceramic green sheet laminate.

After that, in Step S7 shown in FIG. 5, the ceramic green sheet laminate 80 is sintered to obtain the ceramic stack 82 (see FIG. 14).

Subsequently, in Step S8 shown in FIG. 5, the piezoelectric/electrostrictive elements 18a, 18b, each of which has the multilayered structure, are formed on the both surfaces of the ceramic stack 82, i.e., on the surfaces on which the ceramic green sheets 90A, 90B are laminated as shown in FIG. 14. The piezoelectric/electrostrictive elements 18a, 18b and the ceramic stack 82 are integrated into one unit by sintering. Of course, the piezoelectric/electrostrictive element 18a or 18b may be formed on only one surface of the ceramic stack 82.

After that, in Step S9 shown in FIG. 5, side portions and an end portion of the ceramic stack 82 are cut off by cutting the ceramic stack 82 along cutting lines K1, K2, K3 as shown in FIG. 14. The ceramic stack 82 has the piezoelectric/electrostrictive elements 18a, 18b. As a result of the cutoff, as shown in FIG. 1, the piezoelectric/electrostrictive device 10A is obtained, in which the piezoelectric/electrostrictive elements 18a, 18b are formed on the ceramic substrate 16, and the pair of thin plate sections 12a, 12b having the mutually opposing end surfaces 32a, 32b are formed.

Several orders or timings of cutting are applicable. The cutting may be performed along the cutting line K3 after performing the cutting along the cutting lines K1, K2. Alternatively, the cutting may be performed along the cutting lines K1, K2 after performing the cutting along the cutting line K3. Of course, these cutting operations may be performed simultaneously. The end surface of the fixed section 14 opposed to the cutting line K3 may be appropriately cut. After the cutting, scraps or the like resulting from the cutting are removed, for example, by ultrasonic cleaning.

Next, the respective constitutive elements of the piezoelectric/electrostrictive device 10A according to the first embodiment will be explained.

A variety of members are attached to the mutually opposing attachment surfaces 32a, 32b of the pair of thin plate sections 12a, 12b depending on the use of the piezoelectric/electrostrictive device 10A. For example, when the piezoelectric/electrostrictive device 10A is used as a displacement element, a shield plate for an optical shutter or the like is attached. Especially, when the piezoelectric/electrostrictive device 10A is used for the positioning of a magnetic head of a hard disk drive or for a ringing-suppressing mechanism, a member required to be positioned is attached, including a magnetic head, a slider provided with a magnetic head, and a suspension provided with a slider.

As described above, the fixed section 14 serves as a part for supporting the thin plate sections 12a, 12b. For example, when the piezoelectric/electrostrictive device 10A is utilized to position a magnetic head of a hard disk drive as described above, the fixed section 14 is supported by and secured to, for example, a carriage arm attached to VCM (voice coil motor) or a suspension or a fixed plate attached to the carriage arm. Accordingly, the entire piezoelectric/electrostrictive device 10A is fixed. Further, as shown in FIG. 1, the connecting terminals 28, 30 and other members for driving the piezoelectric/electrostrictive elements 18a, 18b may be arranged on the fixed section 14.

The materials of the fixed section 14 are not specifically limited as long as the materials have certain rigidity. However, the ceramics, to which the ceramic green sheet-laminating method is applicable, can be preferably used as described above.

Specifically, proposed materials include zirconia such as fully stabilized zirconia or partially stabilized zirconia, alumina, magnesia, silicon nitride, aluminum nitride, or titanium oxide as a major component. Further, materials containing a mixture of the foregoing compounds as a major component are also proposed. However, it is preferable to use a material containing zirconia, especially fully stabilized zirconia as a major component and a material containing partially stabilized zirconia as a major component, in view of high mechanical strength and high toughness.

As described above, the thin plate sections 12a, 12b serve as parts driven in accordance with the displacement of the piezoelectric/electrostrictive elements 18a, 18b. Each of the thin plate sections 12a, 12b is a thin plate-shaped member having flexibility. The thin plate sections 12a, 12b function to amplify the expansion and contracting displacement of the piezoelectric/electrostrictive element 18a, 18b arranged on the surface thereof to obtain bending displacement. Therefore, the shape and the material quality of the thin plate section 12a, 12b may be selected for securing flexibility and mechanical strength in order not to cause breakage due to some bending deformation. The shape and the material quality of the thin plate section 12a, 12b can be appropriately selected in consideration of the response performance and the operability of the member to be attached to the attachment surfaces 32a, 32b of the thin plate sections 12a, 12b.

Ceramic materials same as the fixed section 14 can be preferably used for the material of the thin plate sections 12a, 12b. A material containing zirconia as a major component, especially fully stabilized zirconia, and a material containing partially stabilized zirconia as a major component are used most preferably, because the mechanical strength is large even when a thin-walled member is formed therefrom, the toughness is high, and the reactivity with the piezoelectric/electrostrictive layer 22 and the electrodes 24, 236 is small.

The fully stabilized zirconia and the partially stabilized zirconia are preferably fully stabilized or partially stabilized as follows. Chemical compounds which fully stabilize and/or partially stabilize zirconia include yttrium oxide, ytterbium oxide, cerium oxide, calcium oxide, and magnesium oxide. Zirconia can be stabilized as desired, by adding and containing at least one of the foregoing compounds, or by adding the foregoing compounds in combination as well in place of the addition of one compound.

It is desirable that the respective compounds are added in the following amounts, i.e., 1 to 30 mole %, preferably 1.5 to 10 mole % in the case of yttrium oxide or ytterbium oxide, 6 to 50 mole %, preferably 8 to 20 mole % in the case of cerium oxide, and 5 to 40 mole %, preferably 5 to 20 mole % in the case of calcium oxide or magnesium oxide. Among them, it is especially preferable to use yttrium oxide as a stabilizer. In this case, it is desirable that yttrium oxide is preferably added in a amount of 1.5 to 10 mole %, and more preferably 2 to 4 mole %. It is possible to add, for example, alumina, silica, and/or oxide of transition metal as an additive of a sintering aid or the like within a range of 0.05 to 20% by weight. However, when the piezoelectric/electrostrictive elements 18a, 18b are formed by sintering and integrating materials into one unit by the film formation method, then it is also preferable to add, for example, alumina, magnesia, and/or oxide of transition metal as an additive.

In order to obtain high mechanical strength and stable crystal phase, it is desirable that the average crystal grain diameter of zirconia is 0.05 to 3 μm, preferably 0.05 to 1 μm. As described above, ceramic materials similar to the fixed section 14 can be used for the thin plate sections 12a, 12b. Preferably, the thin plate sections 12a, 12b are made by using substantially the same material. This is advantageous in that the reliability of the joined portions is improved, the strength of the piezoelectric/electrostrictive device 10A is enhanced, and the complexity of production is reduced.

Each of the piezoelectric/electrostrictive elements 18a, 18b has at least the piezoelectric/electrostrictive layer 22 and the pair of electrodes 24, 26 for applying the electric field to the piezoelectric/electrostrictive layer 22. The piezoelectric/electrostrictive elements 18a, 18b can be used, for example, as a unimorph type or a bimorph type. However, the piezoelectric/electrostrictive element of the unimorph type, which is used with the thin plate sections 12a, 12b in combination, is more excellent in stability of the generated displacement amount, and it is more advantageous to reduce weight of the device. Therefore, the piezoelectric/electrostrictive element of the unimorph type is more suitable for the piezoelectric/electrostrictive device 10A.

It is preferable that the piezoelectric/electrostrictive elements 18a, 18b are formed on the side surfaces of the thin plate sections 12a, 12b as shown in FIG. 1, since the thin plate sections 12a, 12b can be driven more greatly.

Piezoelectric ceramic materials are preferably used for the piezoelectric/electrostrictive layer 22. However, it is also possible to use electrostrictive ceramic materials, ferroelectric ceramic materials, and anti-ferroelectric ceramic materials. However, when the piezoelectric/electrostrictive device 10A is used to position the magnetic head of the hard disk drive, for example, it is preferable to use a piezoelectric material having small strain hysteresis, and it is preferable to use a material having a coercive electric field of not more than 10 kV/mm, because the linearity between the displacement amount of the thin plate section 12a, 12b and the driving voltage or the output voltage is considered to be important.

Specified piezoelectric materials may include lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalite. One of these materials can be used singly, or any appropriate mixture or the like of them can be used.

Especially, a material containing lead zirconate, lead titanate, or lead magnesium niobate as a major component, or a material containing sodium bismuth titanate as a major component is preferably used, since such materials have a high electromechanical coupling factor and a high piezoelectric constant. Further, the reactivity with the thin plate section (ceramics) 12a, 12b of such materials is small when the piezoelectric/electrostrictive layer 22 is sintered so that a device of a stable composition can be obtained.

It is also preferable to use a ceramic material obtained by adding to the piezoelectric material described above any one of or a mixture of, for example, oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum.

For example, when lanthanum and/or strontium is contained in major components such as lead zirconate, lead titanate, and lead magnesium niobate, coercive electric field and piezoelectric characteristics may be adjustable in some cases, which is advantageous.

It is desirable not to add a material such as silica which tends to form glass since the material such as silica is readily reacted with the piezoelectric/electrostrictive material during the heat treatment of the piezoelectric/electrostrictive layer 22. As a result, the composition is varied, and piezoelectric characteristics are deteriorated.

On the other hand, it is preferable that the pair of electrodes 24, 26 of the piezoelectric/electrostrictive element 18a, 18b are made of a metal which is solid at room temperature and which is excellent in conductivity. Materials usable for the pair of electrodes 24, 26 include metal such as aluminum, titanium, chromium, iron, cobalt, nickel, copper, zinc, niobium, molybdenum, ruthenium, palladium, rhodium, silver, stannum, tantalum, tungsten, iridium, platinum, gold, and lead, and alloys thereof. Further, it is also preferable to use a cermet material obtained by dispersing the same materials as those of the piezoelectric/electrostrictive layer 22 and/or the thin plate sections 12a, 12b in one of the metals or the alloy described above.

The material of the electrodes 24, 26 of the piezoelectric/electrostrictive element 18a, 18b is selected and determined depending on the method of forming the piezoelectric/electrostrictive layer 22. For example, when the piezoelectric/electrostrictive layer 22 is formed by sintering on the electrode 24 after forming the first electrode 24 on the thin plate section 12a, 12b, it is necessary to use a high melting point metal for the first electrode 24, which does not change at the sintering temperature of the piezoelectric/electrostrictive layer 22. The high melting point metal includes platinum, palladium, platinum-palladium alloy, and silver-palladium alloy. However, the second electrode 26, which is formed on the piezoelectric/electrostrictive layer 22 after forming the piezoelectric/electrostrictive layer 22, can be formed at a relatively low temperature. Therefore, it is possible to use a low melting point metal for the second electrode 26, including aluminum, gold, and silver as a major component.

Each thickness of the electrodes 24, 26 may be often a factor to considerably decrease the displacement of the piezoelectric/electrostrictive element 18a, 18b. Therefore, especially for the electrode formed after sintering the piezoelectric/electrostrictive layer 22, it is preferable to use a material such as an organic metal paste with which a dense and thinner film can be obtained after sintering, including gold resinate paste, platinum resinate paste, and silver resinate paste.

The piezoelectric/electrostrictive device 10A according to the first embodiment can be preferably used for a variety of sensors including ultrasonic wave sensors, acceleration sensors, angular velocity sensors, shock sensors, and mass sensors. The piezoelectric/electrostrictive device 10A according to the first embodiment is further advantageous in that the sensitivity of the sensor can be easily adjusted by appropriately changing the size of an object to be attached between the end surfaces 32a, 32b or between the thin plate sections 12a, 12b.

As for the method of forming the piezoelectric/electrostrictive element 18a, 18b on the surface of the ceramic stack 82 in the method of producing the piezoelectric/electrostrictive device 10A, it is possible to use a thick film formation method such as dipping method, brushing method, and electrophoresis method and a thin film formation method such as ion beam method, sputtering method, vacuum deposition, ion plating method, chemical vapor deposition method (CVD), and plating, as well as the screen printing method described above.

When the piezoelectric/electrostrictive elements 18a, 18b are formed by using one of the film formation methods as described above, the piezoelectric/electrostrictive elements 18a, 18b and the thin plate sections 12a, 12b can be joined and arranged integrally without using any adhesive. It is possible to ensure the reliability and the reproducibility of the device, and it is possible to facilitate integration thereof.

In this embodiment, it is preferable that the piezoelectric/electrostrictive elements 18a, 18b are formed by the thick film formation method of the following reason. When the thick film formation method is used especially for the formation of the piezoelectric/electrostrictive layer 22, the film can be formed by using a paste, a slurry, a suspension, an emulsion, a sol, or the like containing, as a major component, grains or powder of piezoelectric ceramics having an average grain diameter of 0.01 to 5 μm, preferably 0.05 to 3 μm. When the film obtained as described above is sintered, it is possible to obtain good piezoelectric/electrostrictive characteristics.

The electrophoresis method is advantageous in that the film can be formed at a high density with a high shape accuracy. The screen printing method is advantageous to simplify production steps, because the film formation and the pattern formation can be performed simultaneously.

The method of cutting the ceramic stack 82 includes mechanical machining such as dicing machining and wire saw machining as well as electron beam machining and laser machining by using YAG laser and excimer laser.

Figure 15:
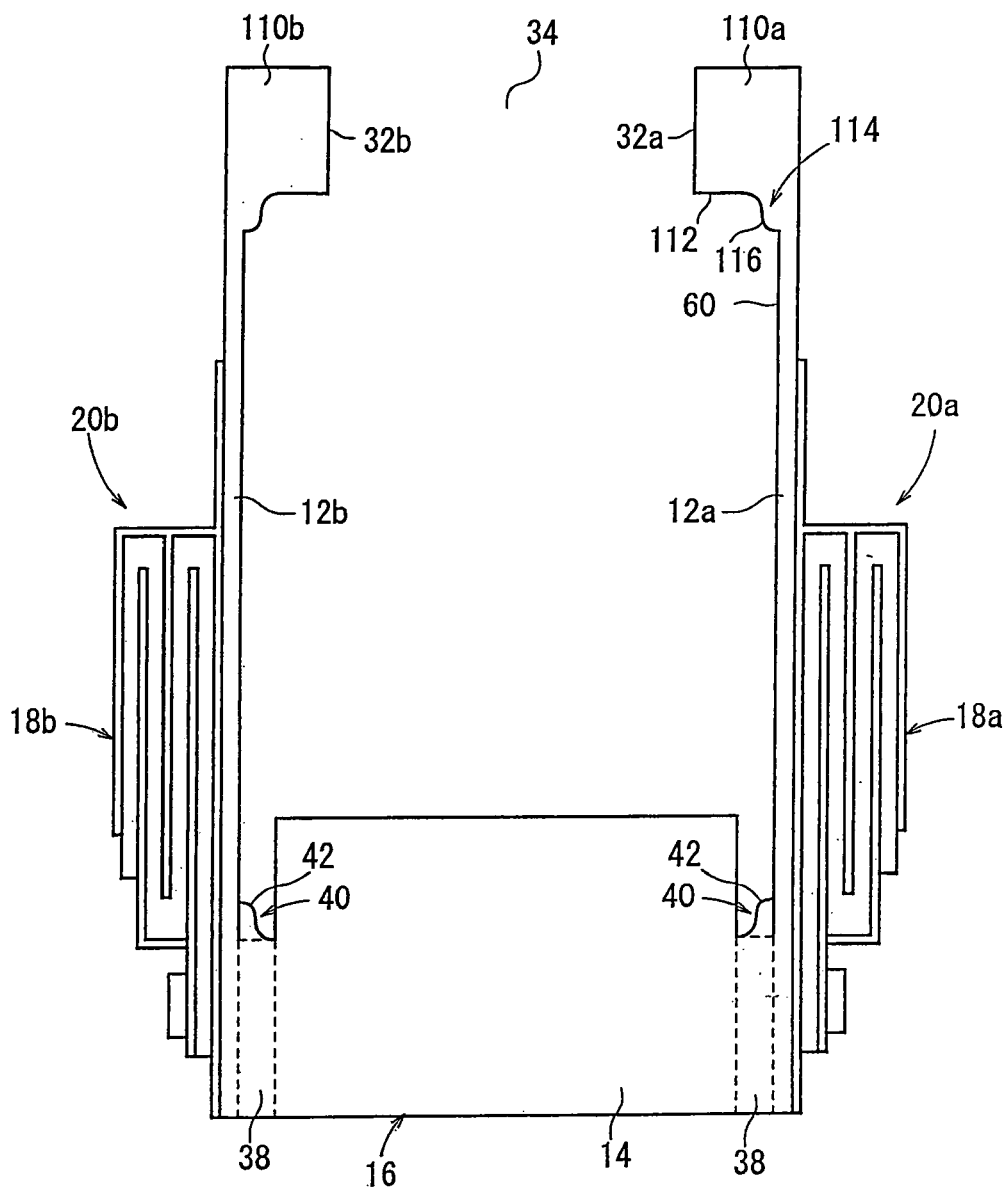
FIG. 15 is a perspective view illustrating a piezoelectric/electrostrictive device according to a second embodiment.

Next, an explanation will be made with reference to FIG. 15 about a piezoelectric/electrostrictive device 10B according to a second embodiment.

The piezoelectric/electrostrictive device 10B according to the second embodiment has a similar structure to that of the piezoelectric/electrostrictive device 10A according to the first embodiment described above. However, the piezoelectric/electrostrictive device 10B is different from the piezoelectric/electrostrictive device 10A in that end portions of the pair of thin plate sections 12a, 12b are inwardly thick-walled.

The thick-walled portions function as movable sections 110a, 110b which are displaceable in accordance with the displacement action of the thin plate sections 12a, 12b. Mutually opposing end surfaces of the movable sections 110a, 110b are attachment surfaces 32a, 32b. The end surface of the movable section 110a, 110b and the end surface of the thin plate section 12a, 12b are disposed on approximately identical planes.

An additional member 116 is provided at a border 114 which is formed by the inner wall surface 60 of the thin plate section 12a (12b) and the side surface 112 of the movable section 110a (110b). The additional member 116 is formed in the same manner as the additional member 42 provided at the border 40 which is formed by the inner wall surface 60 of the thin plate section 12a (12b) and the side surface 62 of the short ceramic plate 38 (see FIG. 4). That is, the curve on the surface, which is viewed in a vertical cross section, is a free curve having one inflection point 64 as shown in FIG. 4.

Therefore, when a member required to be positioned such as a shield plate for an optical shutter, a magnetic head, a slider provided with a magnetic head, or a suspension provided with a slider is attached between the attachment surfaces 32a, 32b of the movable sections 110a, 110b, it is possible to avoid the occurrence of stress concentration at the border (border 114) between the thin plate sections 12a, 12b and the movable sections 110a, 110b, which would be otherwise caused by the displacement action of the thin plate sections 12a, 12b. Thus, it is possible to suppress the deterioration of the strength at the border 114.

Figure 16:
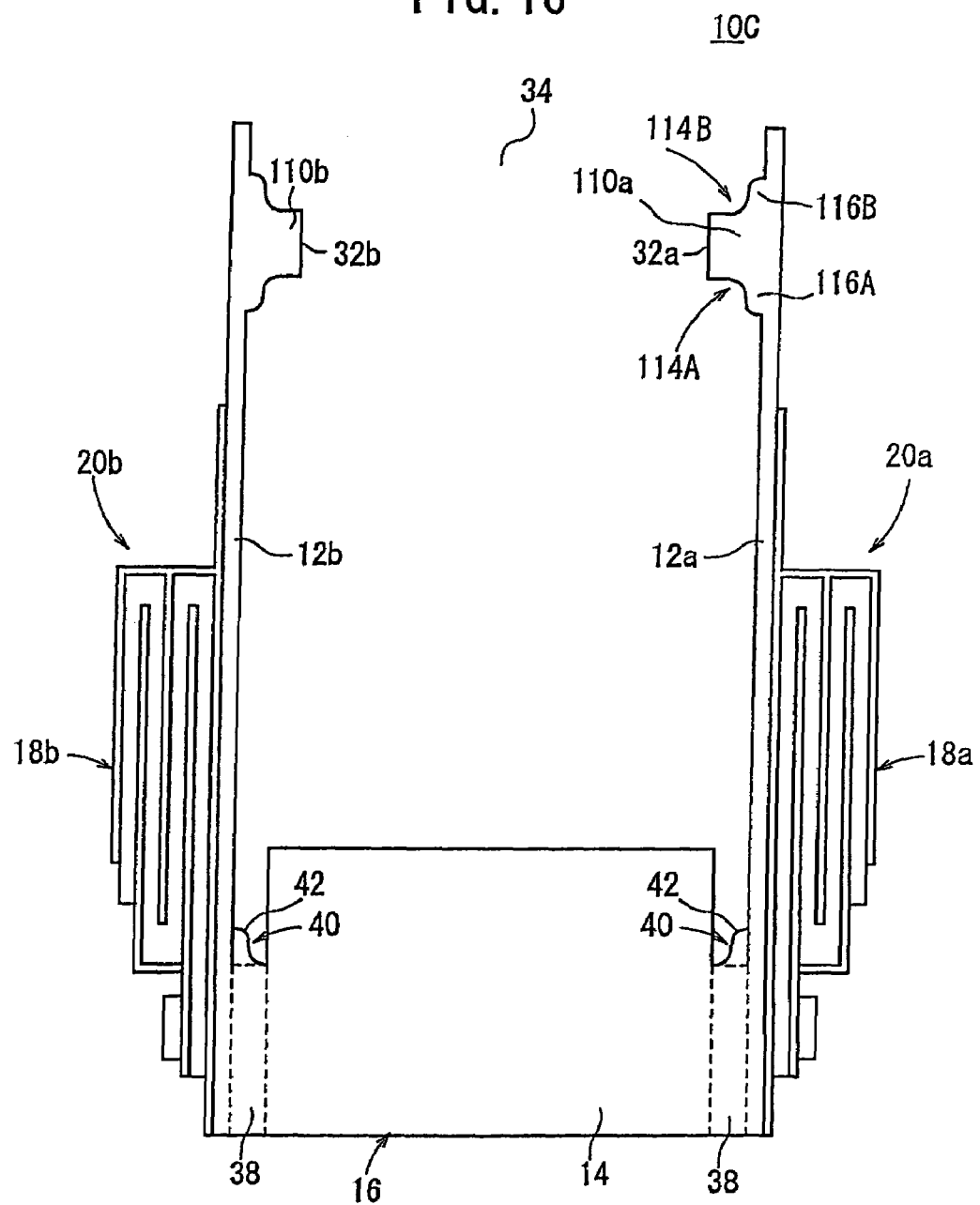
FIG. 16 is a perspective view illustrating a piezoelectric/electrostrictive device according to a third embodiment.

Next, a piezoelectric/electrostrictive device 10C according to a third embodiment will be explained with reference to FIG. 16.

The piezoelectric/electrostrictive device 10C according to the third embodiment has a similar structure to that of the piezoelectric/electrostrictive device 10B according to the second embodiment described above. However, the piezoelectric/electrostrictive device 10C is different from the piezoelectric/electrostrictive device 10B in that movable sections 110a, 110b are arranged at positions deviated toward the fixed section 14. In this connection, two boundaries 114A, 114B are present, for example, between the movable section 110a and the thin plate section 12a. In the third embodiment, additional members 116A, 116B are provided at the boundaries 114A, 114B respectively.

In this embodiment, the movable sections 110a, 110b also function to determine the amount (thickness) and the position (adhesion area) of the adhesive to be used for the attachment, when a component is interposed between the attachment surfaces 32a, 32b.

It is a matter of course that the ceramic stack, the method of producing the ceramic stack, the piezoelectric/electrostrictive device, the method of producing the piezoelectric/electrostrictive device, and the ceramic sintered body according to the present invention are not limited to the embodiments described above, which may be embodied in other various forms without deviating from the gist or essential characteristics of the present invention.

As explained above, according to the ceramic stack and the method of producing the same concerning the present invention, it is possible to enhance the strength of the ceramic stack obtained by stacking a plurality of ceramic plates having different lengths, and it is possible to suppress the influence on the resonance frequency and the displacement amount of a resonance member when a long ceramic plate is used as the resonance member.

Further, according to the piezoelectric/electrostrictive device and the method of producing the same concerning the present invention, it is possible to enhance the strength of a resonance portion of the piezoelectric/electrostrictive device, and it is possible to suppress the influence on the resonance frequency and the displacement amount of the resonance portion.

Furthermore, according to the ceramic sintered body concerning the present invention, it is possible to enhance the strength of the ceramic sintered body obtained by stacking a plurality of ceramic plates having different lengths, and it is possible to suppress the influence on the resonance frequency and the displacement amount of a resonance member when a long ceramic plate is used as the resonance member.

What is claimed is:

1. A ceramic stack comprising a plurality of stacked ceramic plates having different lengths, said ceramic stack including:
    an additional member having a curved surface, said additional member being disposed at a border between a first principal surface of said ceramic plate which is long and a side surface of said ceramic plate which is short, said short ceramic plate being stacked on said first principal surface,
    wherein said additional member has one or more inflection points on a surface thereof as viewed in a cross-sectional direction.

2. The ceramic stack according to claim 1, wherein:
    three types of said ceramic plates having different lengths are stacked so that said ceramic plate having the shortest length is interposed at a central position; and
    said additional member is provided at said border between said first principal surface of said ceramic plate having the longest length and said side surface of said ceramic plate having the shortest length stacked on said first principal surface.

3. The ceramic stack according to claim 1, wherein a thickness of said short ceramic plate is larger than a thickness of said long ceramic plate.

4. The ceramic stack according to claim 1, wherein a length in a cross section by which said additional member contacts said long ceramic plate is substantially the same as a length in said cross section by which said additional member contacts said short ceramic plate.

5. The ceramic stack according to claim 4, wherein said length in said cross section by which said additional member contacts said short ceramic plate is within 1 to ⅕ as long as a thickness of said short ceramic plate.

6. The ceramic stack according to claim 4, wherein said length in said cross section by which said additional member contacts said long ceramic plate is within 10 to ⅕ as long as a thickness of said short ceramic plate.

7. The ceramic stack according to claim 4, wherein said length in said cross section by which said additional member contacts said short ceramic plate is 1 to 50 μm.

8. The ceramic stack according to claim 1, wherein a length in a cross section by which said additional member contacts said short ceramic plate is shorter than a length in said cross section by which said additional member contacts said long ceramic plate.

9. The ceramic stack according to claim 1, wherein a thickness of said long ceramic plate is 3 to 300 μm.

10. The ceramic stack according to claim 1, wherein said additional member comprises a ceramic material.

11. The ceramic stack according to claim 1, wherein said additional member comprises the same material as a material of said long ceramic plate or said short ceramic plate.

12. The ceramic stack according to claim 1, wherein said additional member comprises a metal material or a material containing said metal material.

13. The ceramic stack according to claim 1, wherein said additional member comprises a cermet material.

14. A ceramic sintered body having a ceramic stack comprising a plurality of stacked ceramic plates having different lengths, said ceramic sintered body including:
    an additional member made of ceramics having a curved surface, said additional member being disposed at a border between a first principal surface of said ceramic plate which is long and a side surface of said ceramic plate which is short, said short ceramic plate being stacked on said first principal surface, wherein said additional member has one or more inflection points on a surface thereof as viewed in a cross-sectional direction; and said long ceramic plate, said short ceramic plate, and said additional member are sintered and integrated into one unit.

15. A piezoelectric/electrostrictive device using a ceramic stack as a substrate, said ceramic stack comprising a large number of stacked ceramic plates having different lengths, wherein said ceramic stack includes an additional member having a curved surface, said additional member being disposed at a border between a first principal surface of one or more of said ceramic plates which are long and one or more of side surfaces of one or more of said ceramic plates which are short, said short ceramic plates being stacked on said first principal surface; and said additional member has one or more inflection points on a surface thereof as viewed in a cross-sectional direction.

16. The piezoelectric/electrostrictive device according to claim 15, wherein a piezoelectric/electrostrictive element is formed on said substrate of said ceramic stack; and said substrate has a thin plate section formed by said long ceramic plates and a fixed section formed by said short ceramic plates.

17. The piezoelectric/electrostrictive device according to claim 16, wherein said piezoelectric/electrostrictive element is arranged on a surface portion of a second principal surface of said thin plate section said second principal surface including said surface portion corresponding to a part of said fixed section.

18. The piezoelectric/electrostrictive device according to claim 16, wherein said piezoelectric/electrostrictive element has a structure including a piezoelectric/electrostrictive layer and an electrode layer which are alternately stacked in a comb-shaped form.

19. The piezoelectric/electrostrictive device according to claim 16, wherein said piezoelectric/electrostrictive element has a structure including not less than four layers of piezoelectric/electrostrictive layers and electrode layers which are alternately stacked in a comb-shaped form.

20. The piezoelectric/electrostrictive device according to claim 15, wherein said substrate has a pair of thin plate sections formed by said long ceramic plates, a fixed section formed by said short ceramic plates and interposed between said pair of thin plate sections, and movable sections formed by said short ceramic plates and interposed between ends of said pair of thin plate sections.

* * * * *